(12) United States Patent
Hasegawa et al.

(10) Patent No.: US 7,252,910 B2
(45) Date of Patent: Aug. 7, 2007

(54) FABRICATION METHOD OF SEMICONDUCTOR INTEGRATED CIRCUIT DEVICE AND MASK FABRICATION METHOD

(75) Inventors: Norio Hasegawa, Hinode (JP); Katsuya Hayano, Akishima (JP); Shinji Kubo, Fussa (JP); Yasuhiro Koizumi, Sayama (JP); Yasushi Kawai, Kawagoe (JP)

(73) Assignees: Renesas Technology Corp., Tokyo (JP); Dai Nippon Printing Co., Ltd., Tokyo (JP)

( * ) Notice: Subject to any disclaimer, the term of this patent is extended or adjusted under 35 U.S.C. 154(b) by 494 days.

(21) Appl. No.: 10/762,548

(22) Filed: Jan. 23, 2004

(65) Prior Publication Data
US 2004/0151993 A1   Aug. 5, 2004

(30) Foreign Application Priority Data
Jan. 23, 2003  (JP) ............................ P2003-014838

(51) Int. Cl.
G03F 1/00 (2006.01)
(52) U.S. Cl. ............................................ 430/5
(58) Field of Classification Search .................... 430/5, 430/394; 156/64
See application file for complete search history.

(56) References Cited

U.S. PATENT DOCUMENTS

| | | | |
|---|---|---|---|
| 6,617,265 B2 | 9/2003 | Tanaka et al. | 438/782 |
| 6,656,644 B2 | 12/2003 | Hasegawa et al. | 430/5 |
| 6,656,645 B2 | 12/2003 | Tanaka et al. | 430/5 |
| 6,665,065 B1 * | 12/2003 | Phan et al. | 356/237.1 |
| 2002/0042007 A1 | 4/2002 | Miyazaki et al. | 430/5 |
| 2002/0098421 A1 | 7/2002 | Hasegawa et al. | 430/5 |
| 2003/0109126 A1 | 6/2003 | Terasawa et al. | 438/612 |
| 2003/0139055 A1 | 7/2003 | Hasegawa et al. | 438/725 |
| 2003/0180670 A1 | 9/2003 | Hasegawa et al. | 430/494 |
| 2003/0192567 A1 * | 10/2003 | Koizumi et al. | 134/1 |

FOREIGN PATENT DOCUMENTS

| | | |
|---|---|---|
| JP | 5-289307 | 11/1993 |
| JP | 2002-23340 | 1/2002 |
| JP | 2002-62634 | 2/2002 |
| JP | 2002-118049 | 4/2002 |
| JP | 2002-122980 | 4/2002 |
| JP | 2002-131883 | 5/2002 |
| JP | 2003-287875 | 10/2003 |

* cited by examiner

Primary Examiner—S. Rosasco
(74) Attorney, Agent, or Firm—Antonelli, Terry, Stout & Kraus, LLP.

(57) ABSTRACT

A mask fabrication time is shortened. By patterning an electron-sensitive resist film coated on a main surface of a mask substrate, a pellicle is mounted on the main surface of the mask substrate immediately after a resist pattern made from an electron beam sensitive resist film and having light-shielding characteristics with respect to exposure light is formed. Subsequently, by irradiating a laser beam to defect made from the electron beam sensitive resist film with the pellicle being mounted on the mask substrate, the defect is removed. Since the defect can be removed without removing the pellicle, the mask fabrication time can be shortened.

21 Claims, 26 Drawing Sheets

FABRICATION METHOD OF SEMICONDUCTOR INTEGRATED CIRCUIT DEVICE AND MASK FABRICATION METHOD

BACKGROUND OF THE INVENTION

The present invention relates to a mask fabrication method and a technique for fabricating a semiconductor integrated circuit device, and more specifically to a technique effectively applied to mask fabrication to transfer desired patterns onto a semiconductor wafer.

Generally, masks used in an exposure technique each have a structure of providing, on a mask blank transparent to exposure light, a light-shielding pattern made from a metal film such as chrome. An example of the manufacturing process includes the following. First of all, a metal film made from light-shielding chrome etc. is deposited on the transparent mask blank, and an electron beam sensitive resist film is coated thereon. Subsequently, an electron beam is illuminated to a specified location of the electron beam sensitive resist film by an electron beam writer etc., and this illuminated resist film is developed to form a desired resist pattern. At this time, there is the case in which a resist pattern (defect) other than the desired resist pattern may be formed. Thereafter, by using, as an etching mask, the resist pattern formed on the mask blank to etch the lower metal film, a desired light-shielding pattern made from a metal film is formed. At this time, light-shielding film defect is also formed by a resist pattern other than the desired resist pattern. Then, after removing the left resist pattern, presence or absence of the defect is determined by carrying out defect inspection. If any defect is detected, for example, a laser beam or ion beam is irradiated to the detected defect to remove it. Subsequently, after a mask without defect is prepared through a washing step, a protection pellicle is mounted on a main surface (surface on which a desired light-shielding pattern is formed) so that no fault by adhesion of foreign matters occurs. A half-tone type phase-shift mask is also fabricated in almost the same process by simply replacing the metal film with a half-tone phase-shift film.

Furthermore, for the purpose of simplifying the process and forming the pattern with a high degree of accuracy, a method of forming a light-shielding film by a resist film is disclosed, for example, in Japanese Patent Laid-open No. 5-289307. This method utilizes such a property that a normal electron beam sensitive resist film or light-sensitive resist film shields vacuum ultraviolet radiation with a wavelength of 200 nm or lower. According to this method, a metal-film etching process or resist-film removing process is made unnecessary, whereby it is possible to reduce manufacturing costs of the mask, improving dimensional accuracy, and reduce a quantity of defect (for example, see Patent Document 1). Additionally, also with respect to defect repair, a method of using a regular laser beam or a FIB (Focused Ion Beam), etc. is disclosed.

[Patent Document 1]
Japanese Patent Laid-open No. 5-289307

SUMMARY OF THE INVENTION

However, in the above mask fabrication technique, there is an important problem of how a mask fabrication time is shortened. Particularly, with regard to the mask whose resist film is composed of light-shielding patterns, there becomes an important problem of how efficient inspection and/or defect repair are carried out in actually producing the mask.

An object of the present invention is to provide a technique capable of shortening the manufacturing time of a mask.

An object of the present invention is to provide a technique capable of shortening the manufacturing time of a semiconductor integrated circuit device.

The above and other objects and novel features of the present invention will become apparent from the description of this specification and the accompanying drawings.

Outlines of representative ones of the inventions disclosed in the present application will be briefly described as follows.

That is, the present invention comprises the steps of: forming a light-shielding pattern on a mask substrate; mounting a pellicle on the mask substrate; and repairing defect located on the mask substrate with the pellicle being mounted on the mask substrate.

Additionally, the present invention comprises the steps of: forming a light-shielding pattern on a mask substrate; mounting a pellicle on the mask substrate; repairing defect located on the mask substrate with the pellicle being mounted on the mask substrate, and fabricating a mask; and forming a desired resist pattern on a wafer by an exposure process using the above-mentioned mask.

DESCRIPTION OF THE PREFERRED EMBODIMENTS

Figure 1:
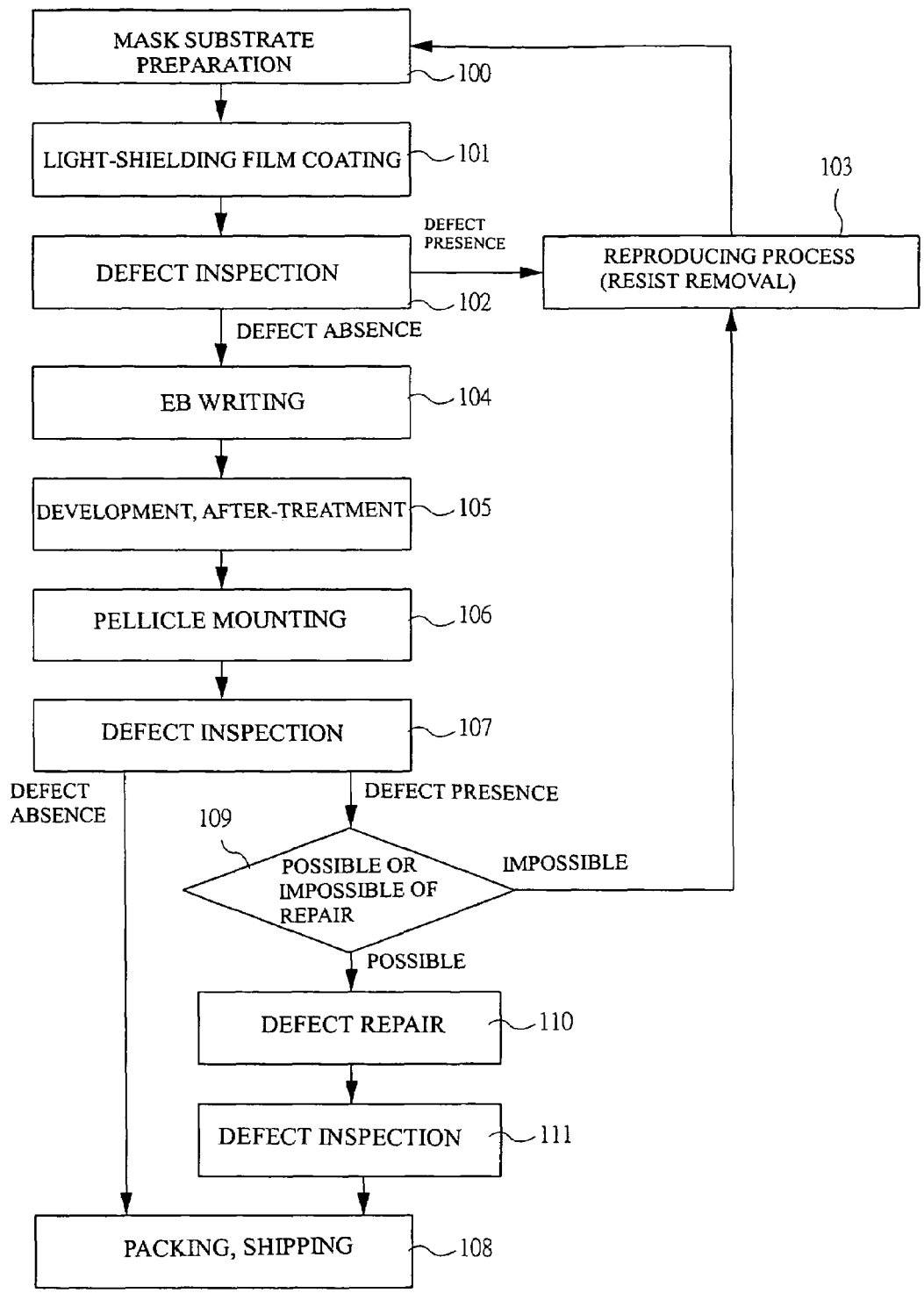
FIG. 1 is a process chart showing one example of a mask fabrication method according to one embodiment of the present invention.

Before explaining in detail embodiments of this application, meaning of technical terms used in the present embodiments will be described as follows.

1. A "wafer" means: a silicon single crystal substrate (semiconductor wafer or semiconductor integrated circuit wafer with a generally substantially plane disk shape); a sapphire substrate; a glass substrate; the other insulating, semi-insulating, or semiconductor substrate or the like; and a compound substrate thereof, which are used for fabrication of a semiconductor integrated circuit.

2. A "device surface" means a main surface of a wafer, on the surface of which device patterns corresponding to a plurality of chip regions are formed by photolithography.

3. A "mask" is a generic name of blanks on which pattern originals are drawn, and includes a reticle on which patterns several times larger than original sizes of patterns are formed. It is used for an exposure device using visible, ultraviolet, and other radiations. In the mask, a regular mask, a phase-shift mask, and a resist mask are included.

4. The "regular mask" (metal mask or chrome mask) means a general mask on which mask patterns, including a light-shielding pattern made from a metal and a light-transparent pattern, are formed on a transparent mask blank.

5. The "halftone phase-shift mask" is a kind of phase-shift mask, and includes a halftone shifter in which a halftone film serving as both a shifter and a light-shielding film has a transmittance of 1% or higher and less than 40% and a phase-shift amount reverses a phase of light as compared with a portion having no halftone film.

6. The "resist mask" or "resist light-shielding mask" means a mask in which a film generally including a photosensitive resist as a base is exposed to light by a method of using energy beam lithography, such as an electron beam (ion beam) and light (vacuum ultraviolet, far-ultraviolet, near-ultraviolet rays, visible light), or using photolithography and is patterned on a mask blank. The light-shielding film blocks the wholes or parts of ultraviolet rays such as vacuum ultraviolet, far-ultraviolet, and near-ultraviolet rays, etc. and of visible light. The photosensitivity is a property of the above-mentioned resin itself (however, a light absorbent or light scattering substance may be added in some cases if circumstances require), and an emulsion mask, etc. in which an additive ingredient such as silver halide serves a main part of photosensitivity shall not correspond in principle to the resist mask referred herein. That is, the resist mask does not demonstrate first desired photosensitivity by development but already has photosensitivity before the development or at the time of being coated on the mask blank or the like. However, needless to say, the mask is allowed to include various additives in addition to them. The resist generally contains an organic resin as a main component, but an inorganic substance may be added to the resist.

7. In the semiconductor field, ultraviolet rays are classified as follows. The wavelength of an ultraviolet ray is less than approximately 400 nm and approximately 50 nm or higher; that of a near-ultraviolet ray is 300 nm or higher; that of a far-ultraviolet ray is less than 300 nm and 200 nm or higher; and that of a vacuum ultraviolet ray is less than 200 nm. Note that, needless to say, main embodiments of the present application can be achieved also outside a far-infrared range by a KrF excimer laser whose the wavelength is less than 250 nm and of 200 nm or higher. It is also possible to apply the principle of the present invention even in a short-wavelength edge region in which the wavelength of the ultraviolet ray is less than 100 nm and 50 nm or higher and in a visible short-wavelength edge region of approximately 400 nm to approximately 500 nm.

8. If referred to, the term "light-shielding (light-shielding region, light-shielding film, and light-shielding pattern, etc.)" indicates that it has optical characteristics in which at most 40% of exposure light illuminated to the region are transmitted. Generally, a mask with a transmittance of several percent to less than 30% is used. Particularly, in a binary mask (or binary light-shielding pattern) used instead of a conventional chrome mask, the transmittance of the light-shielding region is nearly 0, that is, less than 1%, preferably less than 0.5%, or more practically less than 0.1%. Meanwhile, when referred to, the term "transparent (transparent film, transparent region)" indicates that it has optical characteristics in which at least 60% of exposure light illuminated to the region are transmitted. The transmittance of the transparent region is nearly 100%, that is, 90% or more, or preferably 99% or more.

9. If the term "metal" is referred to in a mask light-shielding material, it indicates chrome, chrome oxide, or similar compounds of other metals, and, more generally, a simple substance, compound, and complex, etc., each of which contains a metal element and demonstrates light-shielding effects, are included.

10. The "resist film" generally contains organic solvent, a base resin, and photosensitive agent as main ingredients and is constituted by adding other ingredients to them. The photosensitive agent causes a photochemical reaction by exposure light such as ultraviolet rays or electron beams, and a product, by the photochemical reaction or a reaction in which a product by the photochemical reaction is used as a catalyst, greatly varies the dissolution rate of the base resin to development liquid and forms a pattern by exposure and by a development treatment performed after exposure. A resist, in which the dissolution rate of the base resin in an exposure section to developer is varied from low to high, is called a positive type resist, and a resist, in which the dissolution rate of the base resin in the exposure section to the developer is varied from high to low, is called a negative type resist. In an ordinary resist film, no organic material is contained in the main ingredient. However, by way of exception, a resist film containing Si is also included in this ordinary resist film. The difference between the ordinary resist film and a photosensitive SOG (Spin On Glass) are that the photosensitive SOG contains Si—O and Si—N, etc. as main ingredients and portions of such ingredients are inorganic materials. The main bone structure of the photosensitive SOG is $SiO_2$. Whether it is organic or inorganic is decided depending on whether $CH_3$, etc. are bound to its dead end portion. Generally, to be organically terminated is more stable and is popularly used. However, regardless of the main parts of the photosensitive SOG, both organic and inorganic terminations are acceptable.

11. If referred to, the term "semiconductor integrated circuit device" includes not only one formed on a semiconductor, such as a silicon wafer and a sapphire substrate, or on an insulator substrate but also one formed on other insulation substrate, such as a glass including a TFT (Thin-Film-Transistor) and a STN (Super-Twisted-Nematic) liquid crystals, etc., unless otherwise specified.

12. The term "hole pattern" means a microscopic pattern such as a contact hole and a through hole having a two-dimensional size almost equivalent to or smaller than the wavelength of exposure on a wafer. Generally, the hole pattern on a mask is formed into square, rectangle close to the square, or octagon, etc., but the hole pattern on a wafer often becomes close to circle.

13. The term "line pattern" means a band-shaped pattern for forming a wiring, etc. on a wafer.

In the embodiments described below, the invention will be described in a plurality of sections or embodiments when required as a matter of convenience. However, these sections or embodiments are not irrelevant to each other unless otherwise stated, and the one relates to the entire or a part of the other as a modified example, details, a supplementary explanation or the like thereof. Also, in the embodiments described below, when referring to the number of elements (including number of pieces, values, amounts, ranges, or the like), the number of elements is not limited to a specific number unless otherwise stated, or except the case where the number is apparently limited to a specific number in principle, or the like. The number larger or smaller than the specified number is also applicable. Further, in the embodiments described below, it goes without saying that the components (including element steps or the like) are not always essential unless otherwise stated, or except the case where the components are apparently essential in principle, or the like. Similarly, in the embodiments described below, when the shape of the components and the like, or the positional relation and the like thereof, or the like are mentioned, the substantially approximate and similar shapes and the like are included therein unless otherwise stated, or except the case where it can be conceived that they are apparently excluded in principle, or the like. This condition is also applicable to the numerical value and the range described above.

Also, components having the same functions are denoted by the same reference symbols throughout the drawings for describing the embodiments, and the repetitive description thereof will be omitted. Additionally, in the drawings used in the present embodiments, to easily see plan views in the drawings, hatching is provided in the views in some cases. Furthermore, in the present embodiments, a MIS•FET (Metal Insulator Semiconductor Field Effect Transistor) representing a field-effect transistor is abbreviated as "MIS", a p-channel type MIS•FET as "pMIS", and an n-channel type MIS•FET as "nMIS". Now referring to the drawings, the embodiments of the present invention will be described in detail as follows.

Embodiment 1

One example of a mask fabrication method according to the present embodiment will be described in line with the process chart of FIG. 1 referring to FIGS. 2 to 6.

Figure 2:
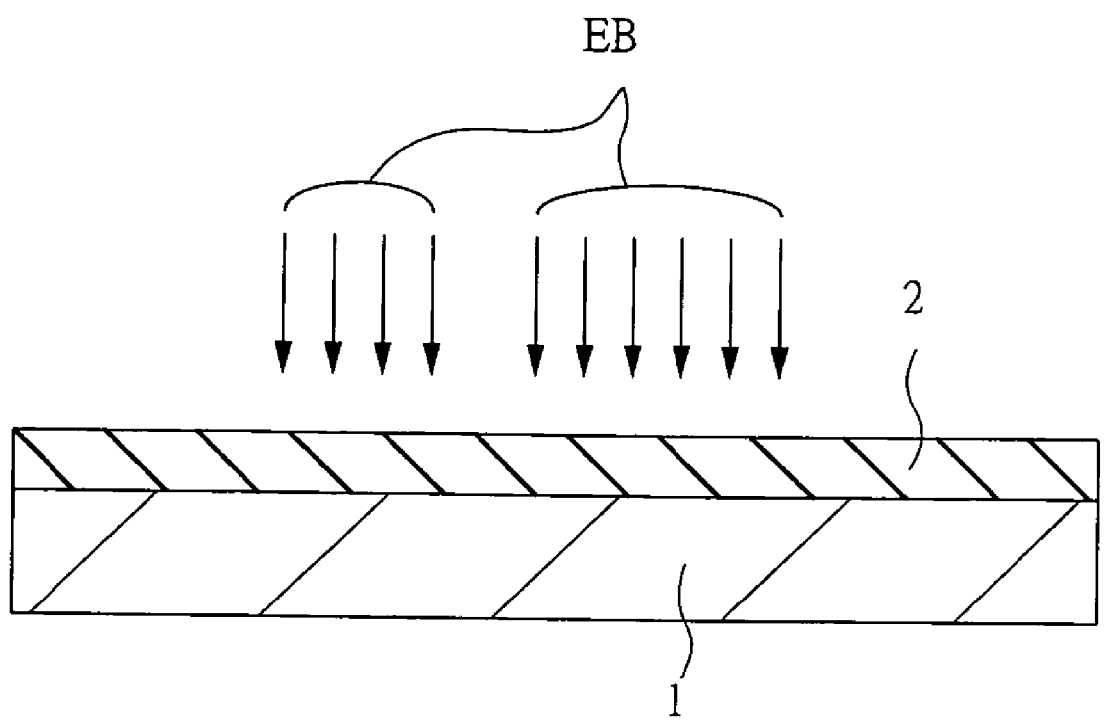
FIG. 2 is a cross-sectional view showing a principal portion of a mask in a mask fabrication process according to one embodiment of the present invention.
Figure 3:
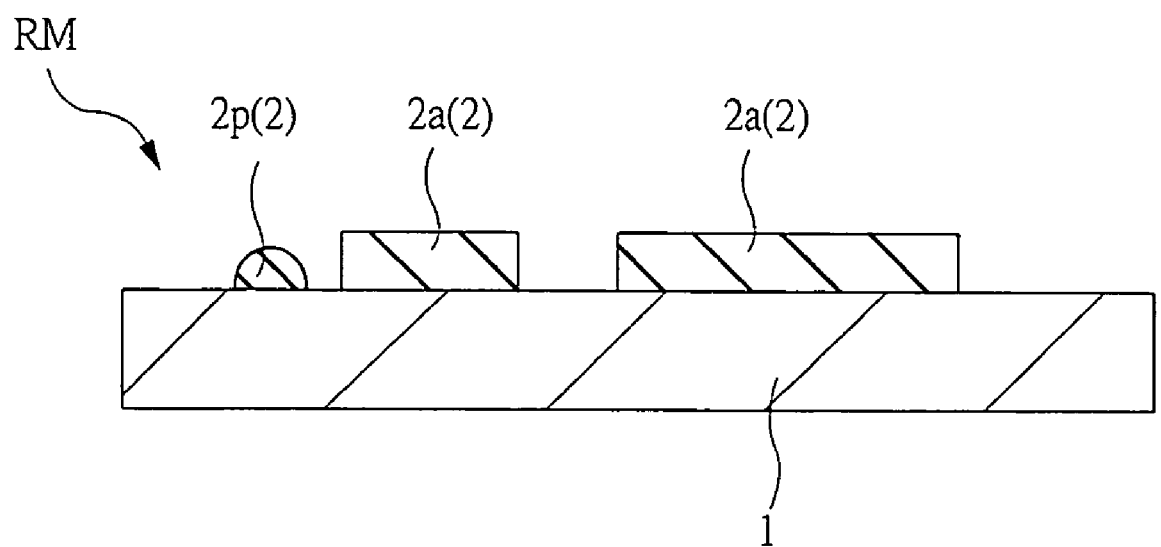
FIG. 3 is a cross-sectional view showing a principal portion of a mask in the mask fabrication process following FIG. 2.
Figure 4:
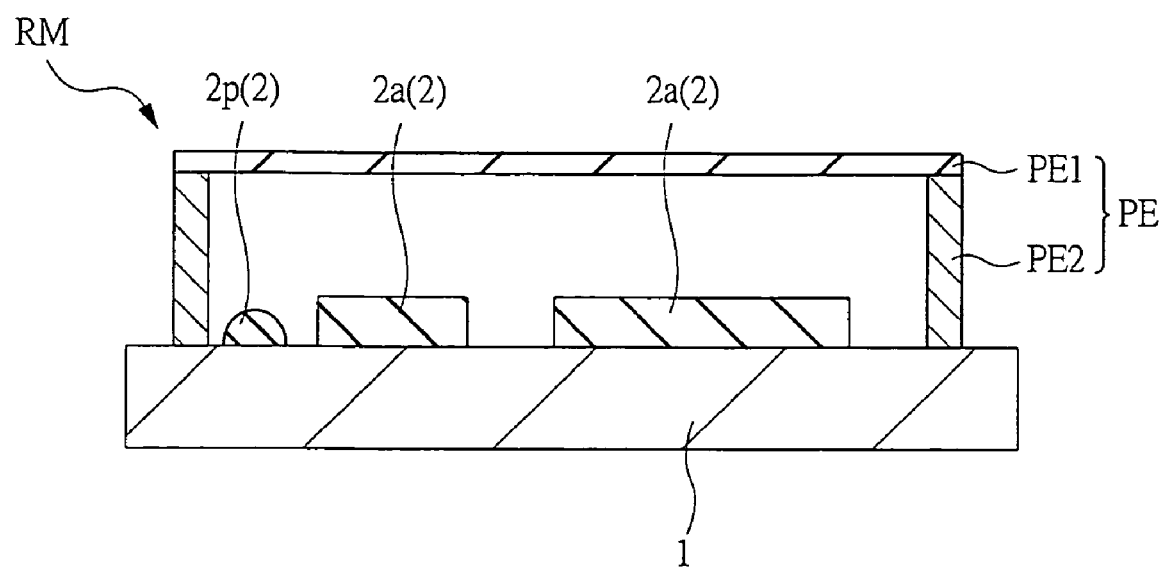
FIG. 4 is a cross-sectional view showing a principal portion of a mask in the mask fabrication process following FIG. 3.

First of all, as shown in FIG. 2, a mask substrate 1 constituting a mask of a first embodiment is prepared (step 100 of FIG. 1). This mask substrate 1 is composed of, for example, a tabular synthetic quartz glass plate transparent to exposure light, and has a first main surface and a second main surface located on an opposite surface (rear surface) thereto. Then, on the first main surface of this mask substrate 1, an organic film such as a negative type electron beam sensitive resist film 2 is coated, and thereafter defect thereof is inspected (steps 101 and 102 of FIG. 1). At this time, if any defect exists, the EB resist film 2 is removed and the mask substrate 1 is reproduced, whereby the fabrication method is returned to step 101 (step 103 of FIG. 1). If no defect exists, an electron beam EB is selectively irradiated to desired pattern portions of the EB resist film 2 (step 104 of FIG. 1). Thereafter, by carrying out a development treatment by a regular method, resist pattern 2a each having a desired shape are formed on the first main surface of the mask substrate 1, and by performing an after-treatment, a mask RM is formed (step 105 of FIG. 1). Here, there is illustrated the case in which defect 2p having been formed in the EB resist film 2 is left. The above-mentioned resist pattern 2a is made from a material, which shields exposure light of an exposure system using the mask RM of this first embodiment, and has properties of shielding exposure light similarly to a chrome (Cr) film etc. used as a light-shielding material in the above-mentioned regular mask. Subsequently, as shown in FIG. 4, a pellicle PE is mounted on the first main surface of the mask substrate 1 immediately after the resist patterns 2a are formed (step 106 of FIG. 1). This can prevent new foreign matters from adhering to the first main surface of the mask substrate 1. The pellicle PE includes a pellicle film PE1 and a pellicle frame PE2. A base section of the pellicle frame PE2 is joined by adhesive so as to contact with the mask substrate 1. Note that a resist mask such as the mask RM according to this first embodiment is, for example, disclosed in Japanese Patent Application No. 11-185221 (filed on Jun. 30, 1999) including the present inventors therein, No. 2000-246466 (filed on Aug. 15, 2000), No. 2000-246506 (filed on Aug. 15, 2000), No. 2000-308320 (filed on Oct. 6, 2000), No. 2000-316965 (filed on Oct. 17, 2000), No. 2000-328159 (filed on Oct. 27, 2000), or the like.

Next, in the first embodiment, with the pellicle PE being mounted, presence or absence of the defect of the mask RM is inspected using a defect inspection device etc. (step 107 of FIG. 1). There are various kinds of defect inspection methods, but, in the mask RM of the first embodiment using the resist patterns 2a directly as a mask, inspection using reflected light has high detection efficiency. Additionally, a method of improving the detection efficiency by processing respective signals of reflection and transmission of light is also effective. And, since all the methods can shorten an inspection time of the mask RM, the mask fabrication time can be shortened. Note that such an inspection method for the mask RM is, for example, disclosed in Japanese Patent Application No. 2002-202071 including the present inventors.

Figure 5:
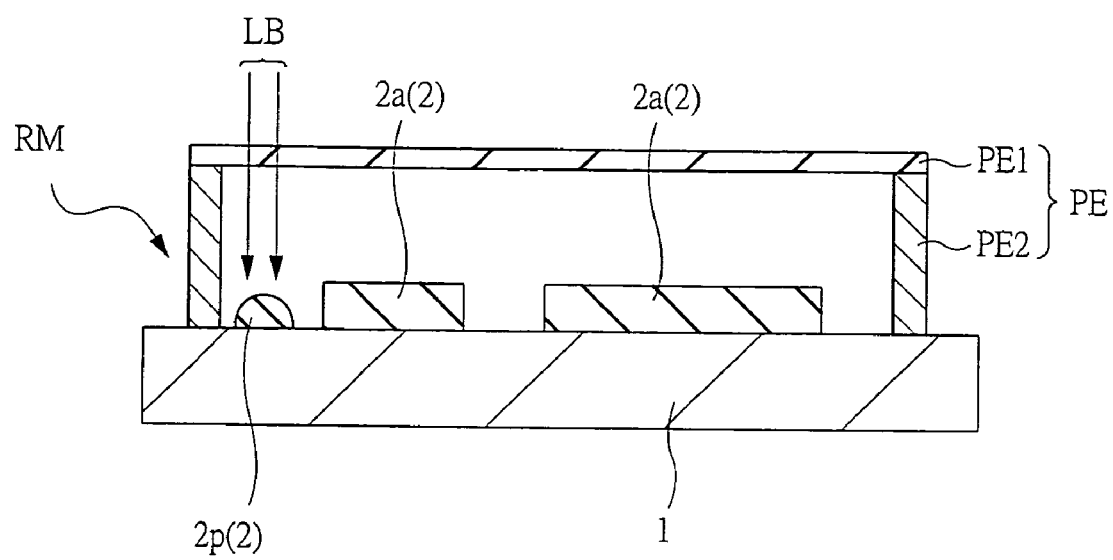
FIG. 5 is a cross-sectional view showing a principal portion of a mask in the mask fabrication process following FIG. 4.
Figure 6:
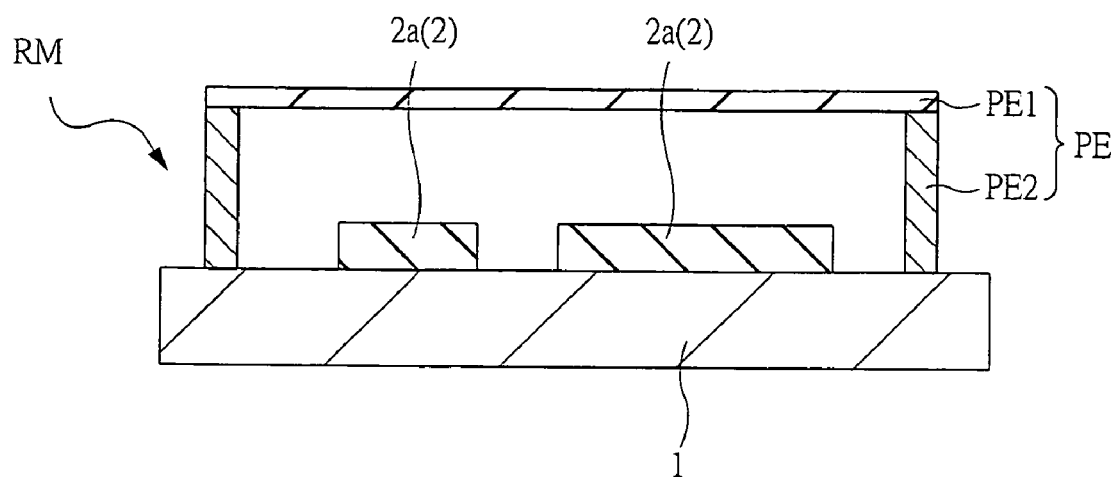
FIG. 6 is a cross-sectional view showing a principal portion of a mask in the mask fabrication process following FIG. 5.

If no defect exists as a result of the defect inspection, the mask RM is packed and shipped (step 108 of FIG. 1). Meanwhile, if any defect is detected, the mask moves to, for example, a defect repairing step as follows. In the first embodiment, description will be made of a detect repairing process by taking, as one example, the repairing of the defect 2p (dark defect) formed in EB resist film 2. First of all, whether or not the defect 2p can be repaired is determined, and if the defect cannot be repaired, the mask substrate is returned to a reproducing process and the EB resist film 2 including the defect 2p on the mask substrate 1 is removed (steps 109 and 103 of FIG. 1). Meanwhile, if the defect can be repaired, the defect 2p of the mask RM is repaired with the pellicle PE being mounted (steps 109 and 110 of FIG. 1). In the defect repair, for example, the laser beam of the exposure wavelength used for forming the patterns onto a wafer is employed. That is, as shown in FIG. 5, with the pellicle PE being mounted, the laser beam LB is irradiated to the defect 2p on the first main surface of the mask substrate 1 to thermally decompose and diminish the defect 2p, as shown in FIG. 6. By this method, the repairing of the defect is carried out. The defect 2p made from an organic matter such as a resist can be decomposed by energy lower than that required for decomposing defect made from a metal. At this time, the wavelength of the laser beam LB preferable has a high absorptance to the EB resist film 2. That is, it is desirably equivalent or close to the wavelength of the exposure light used at the time of performing the exposure process using the mask RM of the first embodiment. For example, in the case of a mask employing an exposure system using a KrF (krypton fluoride) excimer laser beam as a light source, it is desirable to use the laser beam LB having a KrF excimer laser beam wavelength of 248 nm or approximately 248 nm for the defect repair. Further, if the EB resist film 2 has strong absorption characteristics in a wide range including a vicinity of the exposure, the repairing with good efficiency can be achieved within the range. However, from the viewpoint of preventing deterioration of the pellicle, a range of ±10% of the exposure light wavelength is desirable. Light intensity (power) of the laser beam LB used during the defect repair is set to be higher than the light intensity (power) of the exposure light during the exposure. Also, the pellicle PE used in this case is the same as that used for regular exposure. Therefore, if the laser beam LB for defect repair has the wavelength close to that of the exposure light, a ratio at which the laser beam LB penetrates the pellicle PE is also high, so that, during this defect repair, the laser beam LB is not absorbed in the pellicle PE, but is selectively absorbed in the defect 2p of the EB resist film 2. As a result, the defect with good efficiency can be achieved. Of course, since the laser beam LB is not absorbed in the pellicle PE, the pellicle PE is not damaged by the laser beam LB. The resist evaporated or sublimated by irradiation of the laser beam LB scatters and remains inside the pellicle PE (spaced formed by an inner surface of the pellicle PE and the first main surface of the mask substrate 1). However, since a repaired region is ordinarily an extremely small region of the order of im and a residual resist amount is an infinitesimal one of the order of ppm, experimental results of the present inventors indicates that problems of cloudiness of the pellicle PE or occurrence of foreign matters do not occur. Additionally, light for defect repair is not limited to the laser beam, and can be variously modified and changed, and, for example, a ultraviolet ray (a wavelength condition is the same as that of the laser beam LB, for example, a wavelength of 193 to 350 nm) may be used. Furthermore, in order to improve the defect repair efficiency, the inside of the pellicle PE may be filled with an activated gas such as oxygen (O) or an inert gas such as argon (Ar) or helium (He). After the above-mentioned defect has been repaired, the defect inspection is carried out by the manner as described in step 107 of FIG. 1. Thereafter, if no defect exists, the mask RM is packed and shipped (step 108 of FIG. 1).

Thus, according to the first embodiment, with the pellicle PE being mounted on the mask substrate 1 immediately after the resist pattern 2a serving as a light-shielding body during the exposure is formed, the defect inspection and the defect repair are carried out. Generally, in the case of the above-mentioned mask, if any defect is found, the pellicle is removed and the defect is repaired, a washing treatment etc. are performed and, then, the pellicle is mounted again. Therefore, the repairing of the defect leads to complex and troublesome operations. In contrast, in the first embodiment, since the defect can be repaired with the pellicle PE being mounted, it is possible to eliminate the mounting and removing steps of the pellicle during the defect repair. Additionally, since the pellicle PE being mounted, it is possible to prevent new foreign matters from adhering thereto, whereby it is unnecessary to add the washing treatment etc. after the defect repair. Consequently, the defect of the mask RM can be repaired with good efficiency and in a short time. Additionally, since the defect is repaired by utilizing absorption of the laser beam LB for defect repair in the EB resist film 2, the repair with good efficiency can be achieved. Furthermore, power of the laser beam LB for defect repair can be greatly reduced in comparison with the repair of a general metal film made from chrome (Cr) etc. and a half-tone film made from a MoSiON film etc., damage to the mask substrate 1 made from quartz etc. can be extremely suppressed. Additionally, since other inspections are also carried out after the pellicle PE is mounted, the yield of the mask RM can be greatly improved.

Figure 7:
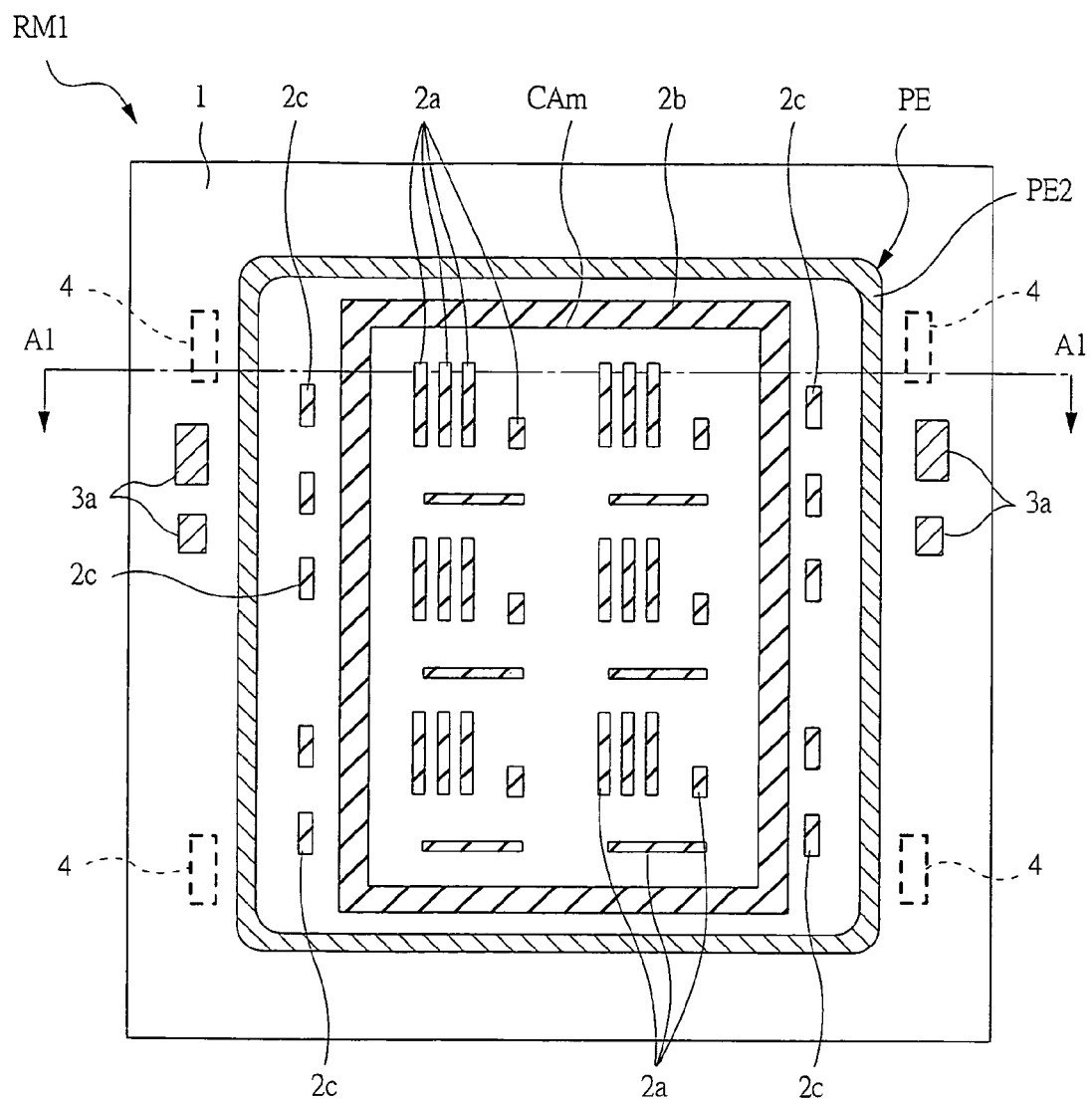
FIG. 7 is a plan view showing one example of the entirety of a mask according to one embodiment of the present invention.
Figure 8:
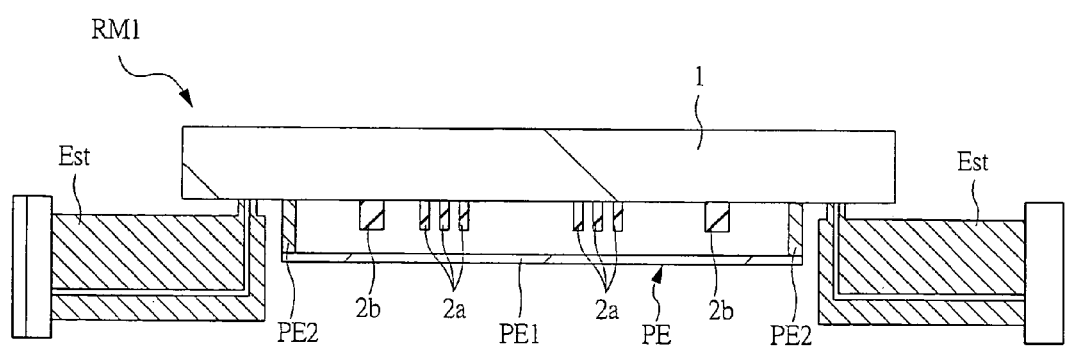
FIG. 8 is a cross-sectional view taken along line A1-A1 in FIG. 7.

Next, description will be made of a specific example of the resist mask according to the first embodiment. First of all, the mask RM1 of FIGS. 7 and 8 indicates one example of a negative type resist light-shielding mask. FIG. 7 is a plan view showing the entirety of the mask RM1, and FIG. 8 is a cross-sectional view taken on line A1-A1 of FIG. 7. At the center of the first main surface of the mask substrate 1 constituting the mask RM1, a plane-rectangular chip transferred region CAm corresponding to a chip region on a wafer is arranged. An outer circumference of the chip transferred region CAm is a peripheral region. In this type of mask RM1 which uses negative type one as an EB resist film to form a light-shielding body, the resist patterns 2a, 2b, and 2c for forming the light-shielding body are selectively left by electron-beam writing or ultraviolet ray exposure, and the mask is formed. Therefore, in the peripheral region of the mask RM, a contact portion and the like of the EB resist film contacting with the exposure system are removed not particularly but usually. That is, it is unnecessary to remove the EB resist film located within the peripheral region of the mask RM1 by adding a special step. On the other hand, the present invention has features of arranging the band-shaped resist pattern 2b for preventing, from being exposed mutually to multiple light, the patterns transferred onto the wafer by a step-and-repeat method etc. This resist pattern 2b is a light-shielding pattern arranged along the outer circumference in such a manner as to define the chip transferred region CAm. A plurality of resist patterns 2a in the chip transferred region CAm are transferred as integrated circuit patterns on the wafer. Also, a plurality of resist patterns 2c arranged in the outer circumference of frame-shaped resist pattern 2b in the peripheral region are marks used for the alignment of the mask substrate 1 and the electron beam writer system when the integrated circuit patterns are transferred onto the mask substrate 1. Additionally, metal patterns 3a formed in an outside peripheral region of the pellicle frame PE2 of the pellicle PE are marks used for the alignment of the mask RM1 and the wafer, or of the mask RM1 and a reduced projection exposure system, and each is made from a light-shielding metal film such as chrome. Additionally, four rectangular contact regions 4 as shown by dotted lines in the vicinity of four corners of the pellicle PE in the peripheral region of the mask RM1 show a portion with which a vacuum suction port of a stage Est in a reduction projection exposure system contacts.

Figure 9:
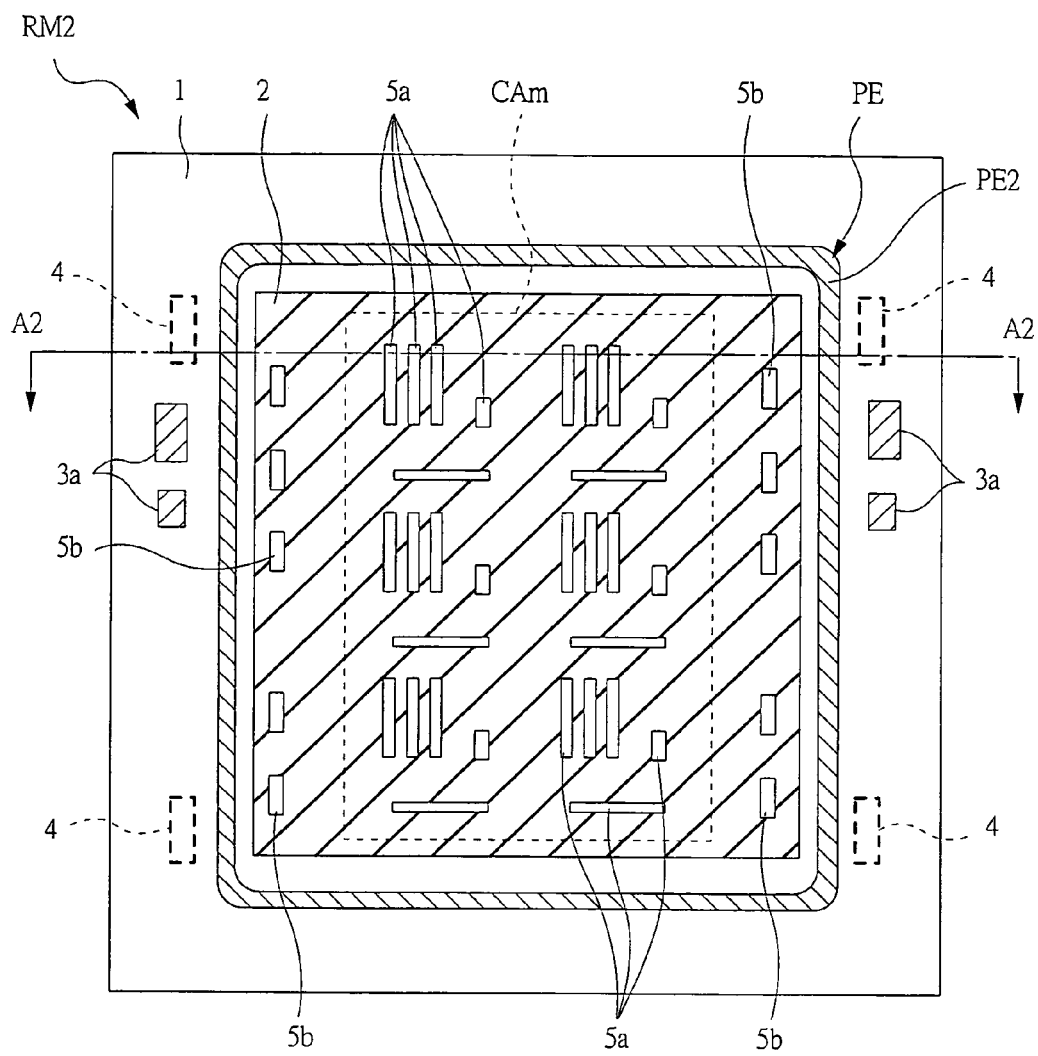
FIG. 9 is a plan view showing one example of the entirety of a mask according to one embodiment of the present invention.
Figure 10:
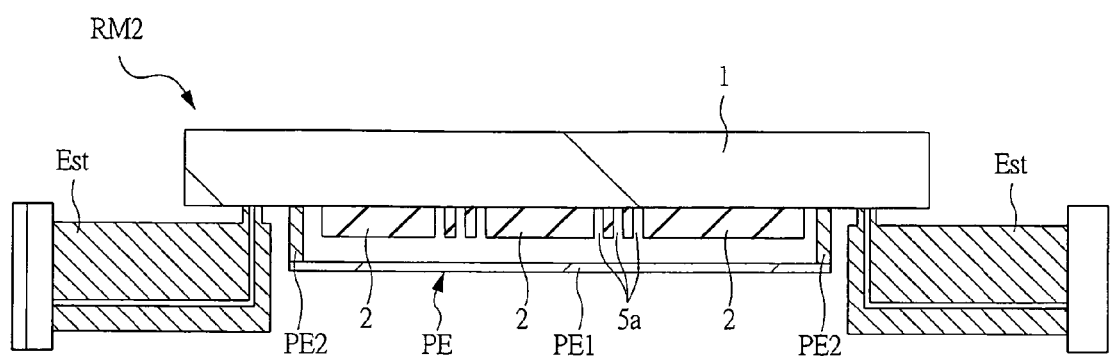
FIG. 10 is a cross-sectional view taken along line A2-A2 in FIG. 9.

Next, a mask RM2 of FIGS. 9 and 10 shows one example of a positive type resist light-shielding mask. In the above-mentioned fabrication process of the mask RM, description has been made of the case in which the EB resist film 2 is of a negative type. However, the present embodiment is not limited to such a type and can be applied also to the case of using a positive type EB resist film. FIG. 9 is a plan view showing the entirety of the mask RM2 and FIG. 10 is a cross-sectional view taken along line A2-A2 of FIG. 9. The feature of this mask RM2 is that the chip transferred region CAm and part of the peripheral region of its outside are covered with the light-shielding positive type EB resist film 2 and the EB resist film 2 is absent in an adhesive portion of the pellicle frame PE2 and in portions of which various kinds of manufacturing equipments contact with the mask substrate 1. The unnecessary portion of the EB resist film 2 in the peripheral region of the mask RM2 is selectively removed by electron beam writing or ultraviolet ray exposure or solvent removal, etc. In the chip transferred region CAm and the peripheral region of the mask RM2, part of the EB resist film 2 is removed to form a plurality of light transparent patterns 5a and 5b. These light transparent pattern 5a are transferred as integrated circuit patterns to be disposed on the wafer. Additionally, the light transparent patterns 5b are marks used for the alignment of the mask substrate 1 and the electron beam writer when the integrated circuit patterns are transferred onto the mask substrate 1.

Figure 11:
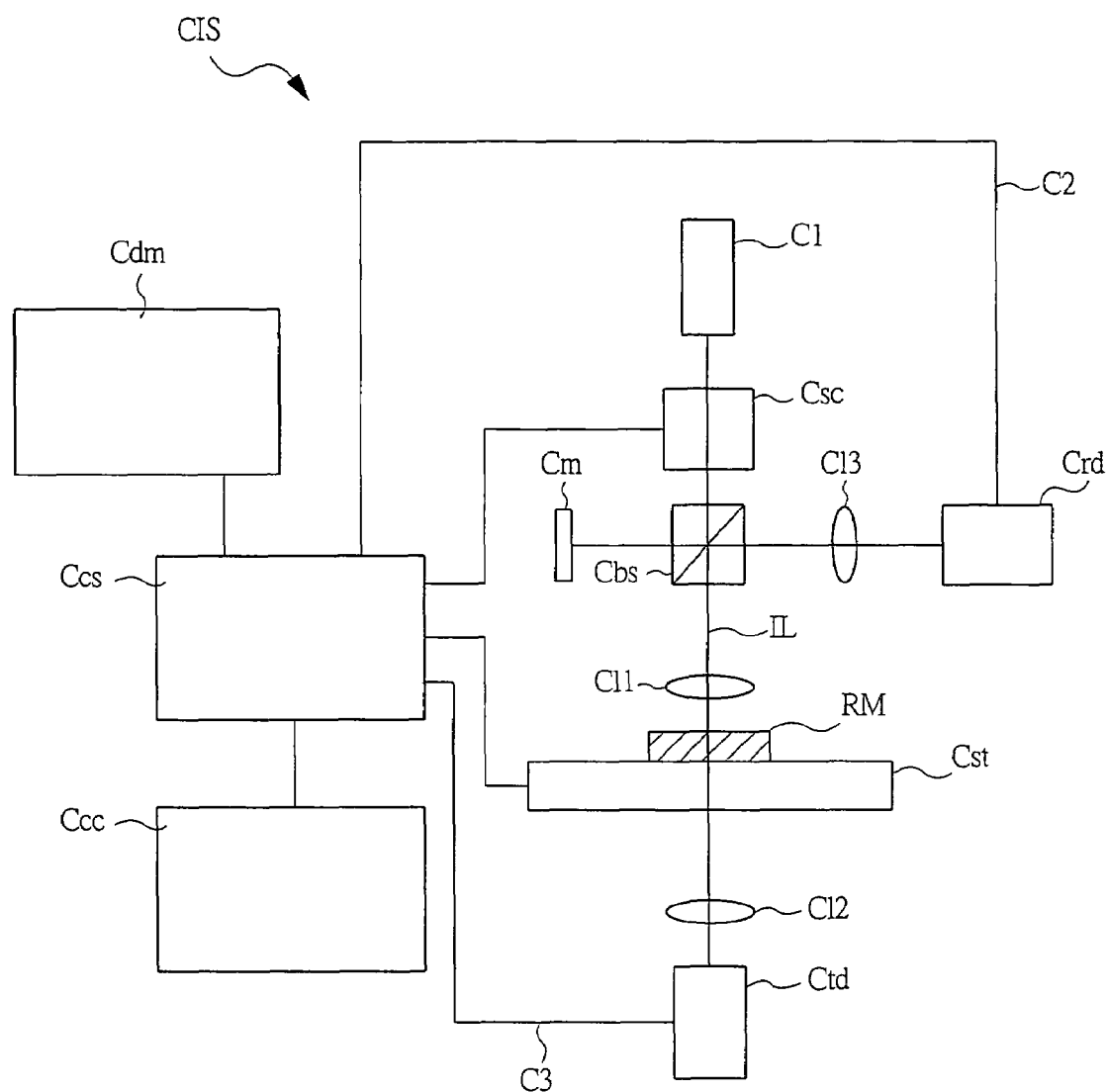
FIG. 11 is an explanatory view showing one example of a defect inspection device used in the mask fabrication method according to one embodiment of the present invention.

Next, FIG. 11 shows one example of the defect inspection device. This defect inspection device is a foreign-matter inspection device CIS such as STAR light of KLA. This foreign-matter inspection device CIS can inspect transmission of inspection light irradiated to the mask RM, inspect reflection of the inspection light, make inspection using transmission and reflection of light, and make inspection about the principles of phase shift, and therefore can obtain various kinds of information from a substance to be inspected (mask RM). Inspection light IL outputted from a laser source C1 passes a scanner Csc and a beam splitter Cbs, and is irradiated to the mask RM to be inspected on a stage Cst via an objective lens Cl1. The mask RM is placed on the stage Cst with the first main surface (i.e., the surface on which the resist patterns 2a are formed) being directed to a side of the laser source C1. The light penetrating this mask RM passes a condenser lens Cl2 and is detected by a transmission light detector Ctd. Meanwhile, the light reflected at the mask RM passes a beam splitter Cbs and a condenser lens Cl3 and is detected by a reflection light detector Crd. Signals detected are processed at an intermediate system Ccs and a control computer Ccc through passages C2 and C3, whereby presence or absence of the defect is determined. The data such as defect information is stored in a data base storage section Cdm. As the inspection light, a laser beam with a long-wavelength of, for example, 365 nm or 436 nm is used. Of course, light with short wavelength may be used as the inspection light. By this, it is possible to improve resolving power of the inspection. Additionally, the reference symbol "Cm" in FIG. 11 is a mirror for forming such a light passage that phase difference occurs in making inspection about the principles of phase shift.

Figure 12:
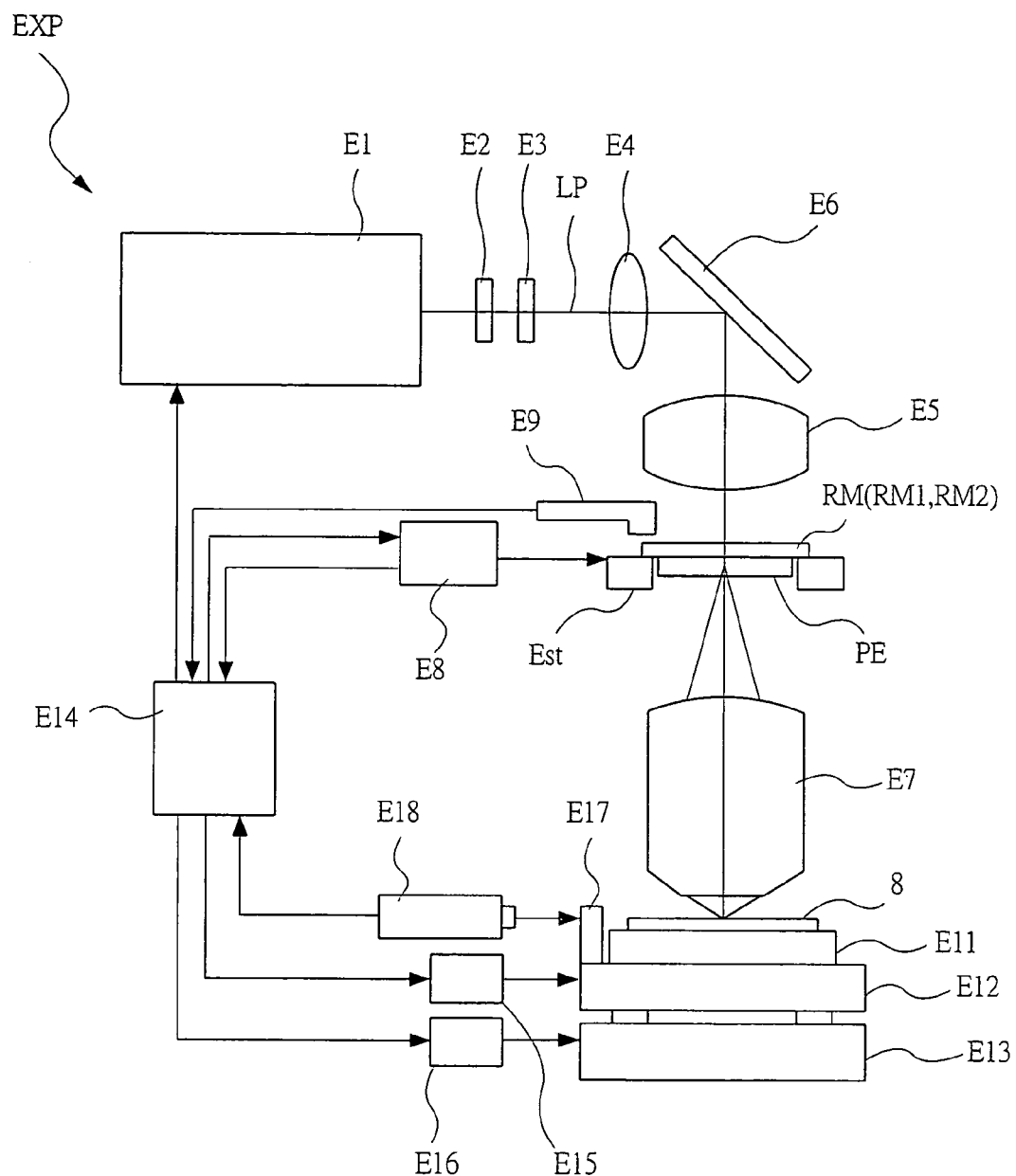
FIG. 12 is an explanatory view showing one example of an exposure device employed in an exposure process using a mask according to one embodiment of the present invention.

Next, referring to FIG. 12, one example of an exposure method using the above-mentioned mask RM (RM1 and RM2) will be described. Note that FIG. 12 shows only portions necessary for explanation of functions of an exposure system, and the other portions are included within portions necessary for an arrangement of a normal exposure system (scanners and steppers).

An exposure system EXP is a scanning type reduction projection exposure system (scanner) of, for example, a reduction ratio of 4 to 1. The exposure conditions of the exposure system EXP include, for example, the following. That is, for example, as exposure light Lp, a KrF excimer laser beam with a exposure wavelength of approximately 248 nm is used, and numerical aperture of optical lens NA=0.65, and a irradiation shape is circular, and coherence ($\delta$: sigma) value=0.7. As the mask, a resist mask such as mask RM (RM1 and RM2) described above and a normal mask are used. However, exposure light Lp is not limited to the above-mentioned one and can be variously modified and changed, and, for example, a Ã-ray, i-ray, ArF excimer laser beam (with a wavelength of 193 nm), or $F_2$ gas laser beam (with a wavelength of 157 nm) may be used.

Light emitted from a exposure light source E1 illuminates a mask (reticle in this case) RM via a flyeye lens E2, an aperture E3, condenser lens E4 and E5, and a mirror E6. Of optical conditions, the coherence is adjusted by varying the size of an opening of the aperture E3. On the mask RM, the above-mentioned pellicle PE is provided to prevent faults of pattern transfer due to adhesion of foreign matters. The mask pattern written on the mask RM is projected on a wafer 8 to be a processed substrate via a projection lens E7. Note that the mask RM is placed on the stage Est controlled by a mask position control means E8 and a mirror E9, and the center thereof and an optical axis of the projection lens E7 are correctly positioned. The mask RM is placed on the stage Est, with the first main surface being directed to a main surface (device face) of the wafer 8 and the second main surface being directed to the condenser lens E5. Therefore, the exposure light Lp is irradiated from a side of the second main surface of the mask RM, penetrates the mask RM, and irradiated to the projection lens E7 from a side of the first main surface of the mask RM.

The wafer 8 is vacuum-absorbed immediately onto a specimen table E11 with the main surface being directed to a side of the projection lens E7. On the main surface of the wafer 8, a photoresist film sensitive to be exposed to exposure light is coated. The specimen table E11 is placed on a Z stage E12 movable toward an optical axis of the projection lens E7, i.e., in a direction perpendicular to a substrate placing surface of the specimen table E11 (z-direction), and is further mounted on a XY stage E13 movable in a direction parallel to the substrate placing surface of the specimen table E11. Since the Z stage E12 and the XY stage E13 are driven respectively by a driving means E15 and E16 in accordance with some control orders from a main control system E14, they can be moved to desired exposure positions. The positions are accurately monitored, by a laser length-measuring device E18, as positions of the mirror E17 fixed to the Z stage E13. Additionally, surface positions of the wafer 8 are measured by a focus position detecting means that a normal exposure system has. By driving the Z-stage E12 based on the measurement results, a surface of the wafer 8 can be always brought to coincide with an imaging surface of the projection lens E7.

The mask RM and the wafer 8 are driven in synchronization with the reduction ratio, and while the exposure region is scanning above the mask RM, it transfers the mask patterns on the wafer 8 for reduction. At this time, the surface position of the wafer 8 is also drive-controlled dynamically by the above-mentioned means with respect to the scanning of the wafer 8. When a circuit pattern on the mask RM is overlapped over a circuit pattern formed on the wafer 8 and is exposed therewith to light, a position of a mark pattern on the wafer 8 is detected by using of an alignment detection optical system and the wafer 8 is positioned based on the detection results and is overlap-transferred. The main control system E14 is electrically connected to a network device, thereby allowing conditions of the exposure system EXP to be remotely monitored etc. In the above-mentioned description, explanation has been made of the case in which the scanning type reduction projection exposure system (scanner) is used as an exposure system, but the present invention is not limited to this case. For example, a reduction projection exposure system (stepper), which transfers the circuit pattern on the mask to the desired portion on the wafer, may be used by repeatedly stepping the wafer to a projected image of the circuit patterns on the mask.

Next, referring to FIG. 13, description will be made of one example of a semiconductor integrated circuit device fabricated by an exposure method using the above-mentioned mask RM (RM1 and RM2) and a normal mask.

Figure 13:
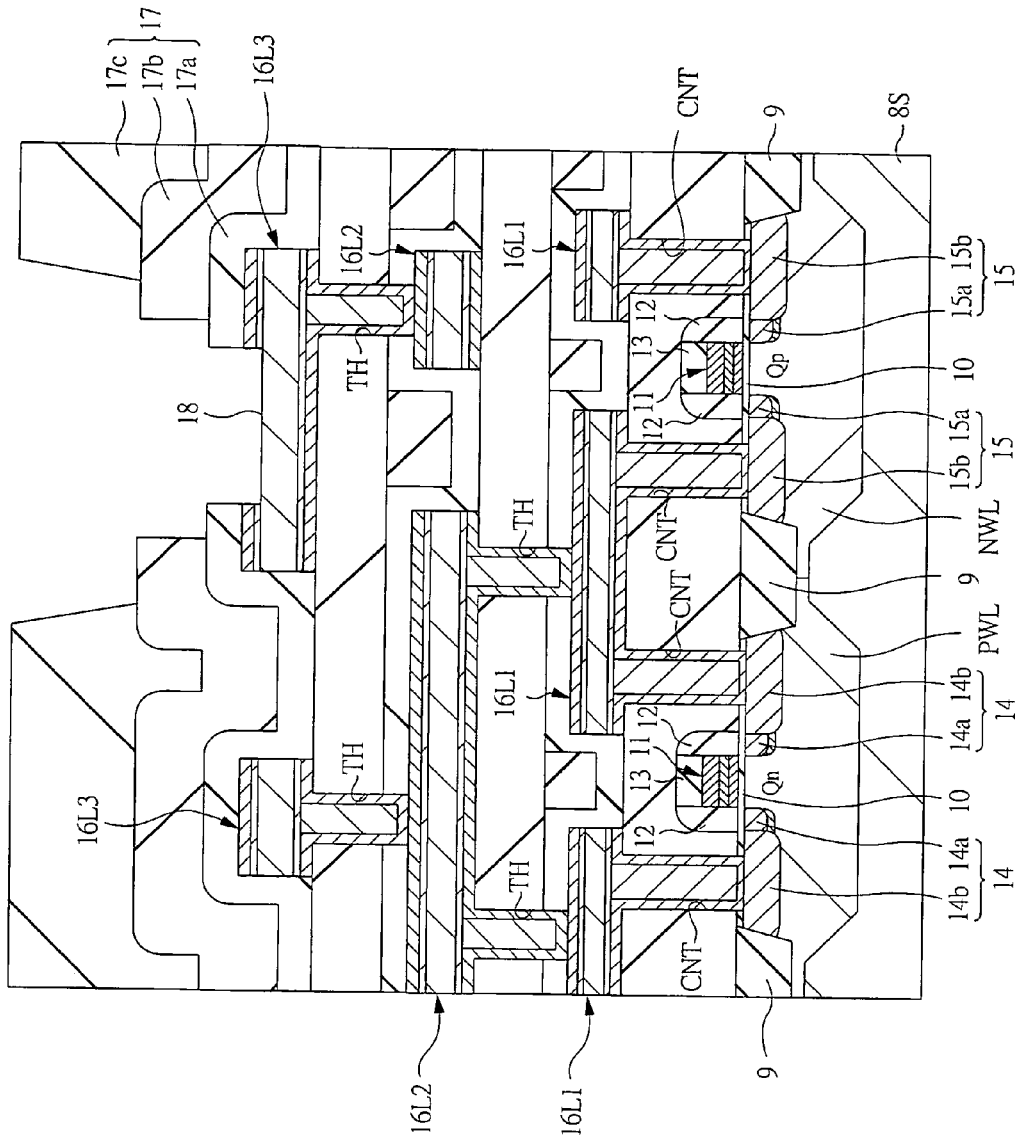
FIG. 13 is cross-sectional view showing a principal portion of a semiconductor integrated circuit device according to one embodiment of the present invention.

FIG. 13 shows a cross-sectional view showing a principal portion of the semiconductor integrated circuit device. A semiconductor substrate (hereinafter simply called "substrate") 8S constituting a semiconductor chip, which is cut from the above-mentioned wafer 8, is made from p-type silicon (Si) single crystal having a specific resistance of, for example, approximately 1 to 10 Ucm, wherein a groove-type isolation region 9 is selectively formed in the main surface (device surface) thereof. This groove-type isolation region 9 is formed by embedding, for example, a silicon oxide film in a groove formed at the main surface of the substrate 8S. In this drawing, a groove-shaped isolation region (SGI (Shallow Groove Isolation) or STI (Shallow Trench Isolation)) is illustrated, but an isolation region made from a silicon oxide ($SiO_2$ etc.) film by, for example, a LOCOS (Local Oxidizer of Silicon) method etc. may be formed.

Additionally, in the substrate 8S, a p-type well PWL and an n-type well NWL are selectively formed up to the predetermined depth from the main surface of the substrate 8S. For example, boron is introduced into the p-type well PWL, and phosphor is introduced into the n-type well NWL. In active regions surrounded by the above-mentioned isolation regions 9 in these p-type well PWL and n-type well NWL, a nMIS Qn and a pMIS Qp are formed, respectively. By these nMIS Qn and pMIS Qp, a CMIS circuit is formed.

Each gate insulating film 10 of the nMIS Qn and the pMIS Qp is made from a silicon oxide film with a thickness of approximately 6 nm. The film thickness of the gate insulating film 10 referred to in this case is represented in terms of silicon dioxide and may not correspond to the actual film thickness in any cases. The gate insulating film 10 may be made from a silicon oxynitride film instead of a silicon oxide film. That is, a structure of segregating nitrogen at the interface between the gate insulating film 10 and the substrate 8S may be adopted. Because the silicon oxynitride film has higher effects of suppressing occurrence of interface levels in the film and reducing electron traps than the silicon oxide film, the hot-carrier resistance of the gate insulating film 10 can be improved and the insulation resistance can be improved. Additionally, since the silicon oxynitride film makes difficult penetrating of impurities thereinto in comparison with the silicon oxide film, variation in threshold voltages caused by the fact that impurities in a gate electrode material are diffused to a side of the substrate 8S can be suppressed by using the silicon oxynitride film. To form the silicon oxynitride film, for example, the substrate 8S may be heat-processed in an atmosphere of a nitrogen-containing gas such as NO, $NO_2$, or $NH_3$.

Each of gate electrodes 11 of the nMIS Qn and the pMIS Qp has a so-called poly-metal gate structure, i.e., a structure of, for example, stacking a metal film such as a tungsten (W) film, on a low-resistant multi-crystal silicon film, via a barrier metal film such as a tungsten nitride (WN) film. However, the gate electrode structure is not limited to this case and may be, for example, a simple substance film one made from a low-resistance multi-crystal silicon film, or may be a so-called polycide structure, i.e., a structure of, for example, stacking a titanium silicide ($TiSi_x$) film or cobalt silicide ($CoSi_x$) film on a low-resistance multi-crystal silicon film. On a side surface of this gate electrode 11, a sidewall 12 made from, for example, a silicon oxide film is formed. Additionally, on a top surface of the gate electrode 11, a cap film 13 made from, for example, a silicon oxide film or silicon nitride ($Si_3N_4$ etc.) film, etc. is formed. Each of nMIS Qn and pMIS Qp channels is formed at a portion of the substrate 8S located immediately below the gate electrode 11.

Each semiconductor region 14 for source and drain of the nMIS Qn is set to have a so-called LDD (Lightly Doped Drain) structure with an $n^-$-type semiconductor region 14a and an $n^+$-type semiconductor region 14b. In both the $n^-$-type semiconductor region 14a and the $n^+$-type semiconductor region 14b, for example, phosphorous (P) or arsenic (As) is introduced, but the impurity concentration of the $n^-$-type one is set lower than that of the $n^+$-type one. Meanwhile, each semiconductor region 15 for source and drain of the pMIS Qp is set to have a so-called LDD structure with a $p^-$-type semiconductor region 15a and a $p^+$-type semiconductor region 15b. In both the $p^-$-type semiconductor region 15a and the $p^+$-type semiconductor region 15b, for example, boron is introduced, but the impurity concentration of the $p^-$-type one is set lower than that of the $p^+$-type one.

On such a substrate 8S, for example, three multi-layer wiring layers are formed. Each multi-layer wiring layer is formed by alternately stacking an interlayer insulating film and a wiring layer on the substrate 8S. In each of first to third wiring layers, first to third layer wirings 16L1 to 16L3 are formed. Each of the first to third layer wirings 16L1 to 16L3 is made from, for example, aluminum, or an aluminum-silicon-copper alloy as a main wiring material. The lowermost first layer wiring 16L1 and the substrate 8S or gate electrode 11 are electrically connected via contact holes CNT formed in an interlayer insulating film. Additionally, the first to third layer wirings 16L1 to 16L3 are electrically connected via through holes TH formed in an interlayer insulating film. The uppermost third layer wiring 16L3 has a surface largely covered with a surface protection film 17, but part of the surface protection film 17 is opened to expose part of the third layer wiring 16L3. The exposed portion of this third layer wiring 16L3 from the surface protection film 17 is an external terminal region 18 for joining a bonding wire or bump electrode. Note that the surface protection film 17 comprises stacking protection films 17a to 17c subsequently from a side of the substrate 8S. The lowermost protection film 17a is made from, for example, a silicon oxide film etc., and the protection film 17b thereon is made from, for example, a silicon nitride film etc., and the uppermost protection film 17c is made from, for example, a polyimide resin etc. In transferring a line pattern such as an active region (isolation region), the gate electrode 11, the first to third layer wirings 16L1 to 16L3, and a well region, for example, the negative type resist film is coated to the main surface of the wafer 8. In transferring a hole pattern such as the contact hole CNT and the through hole TH, for example, the positive type resist film is coated to the main surface of the wafer 8.

Embodiment 2

In a second embodiment, description will be made of a mask having, on the same mask substrate, both of portions in which a light-shielding body for transferring integrated circuit patterns is formed by metal patterns and of portions in which it is formed by resist patterns.

Figure 14:
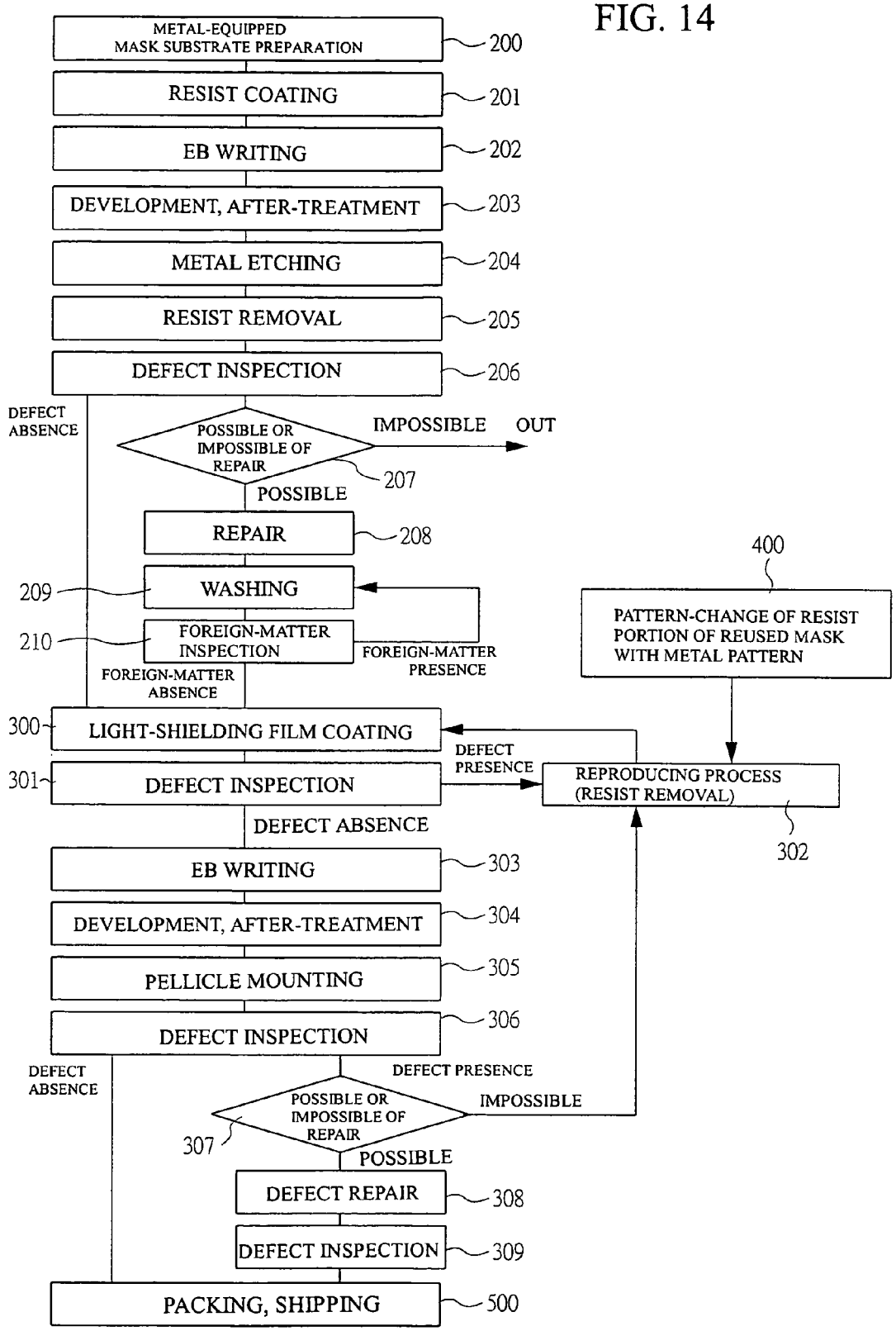
FIG. 14 is a process chart showing one example of a mask fabrication method according to another embodiment of the present invention.
Figure 15:
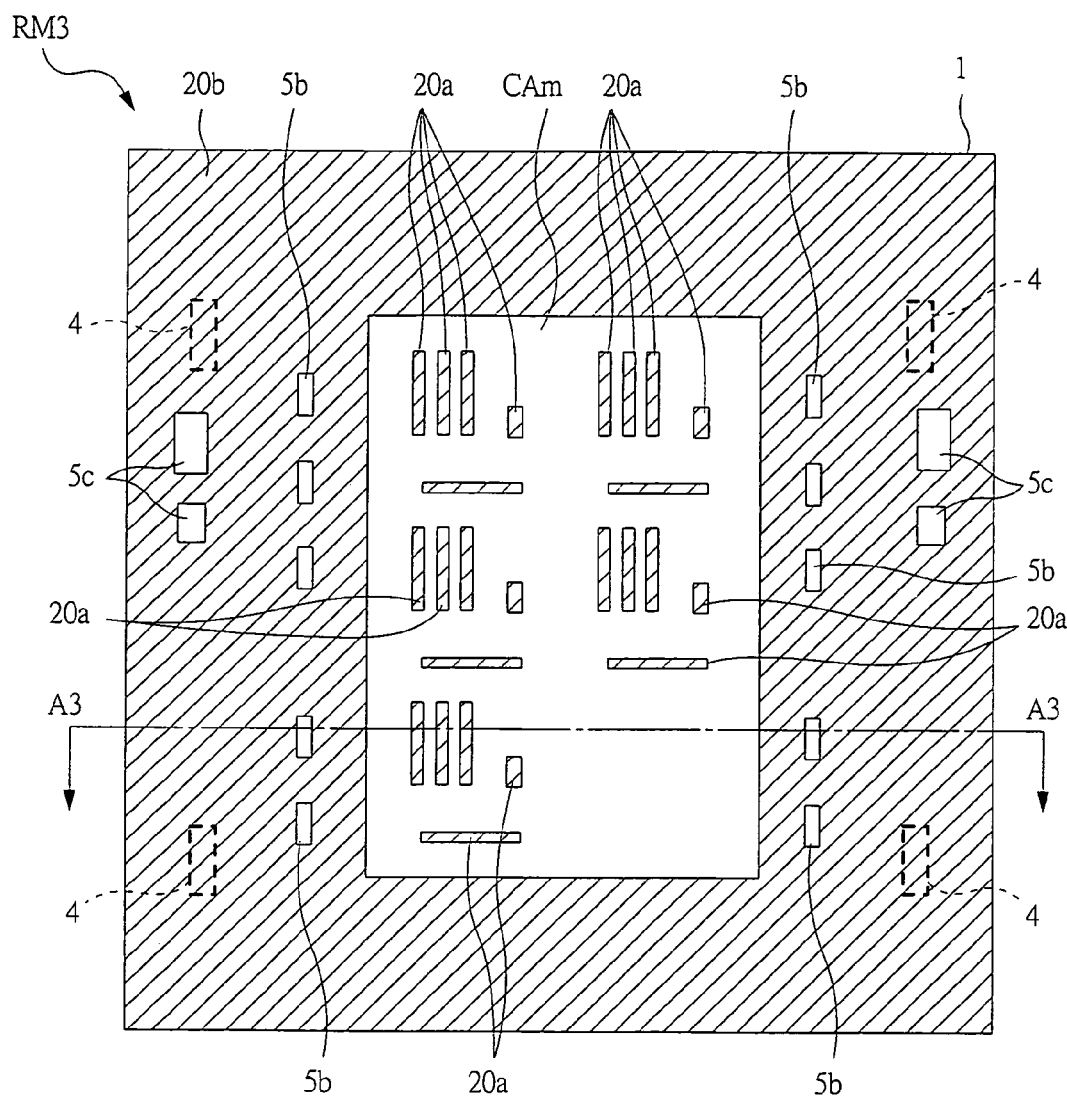
FIG. 15 is a plan view showing the entirety of a mask in a mask fabrication process according to another embodiment of the present invention.
Figure 16:
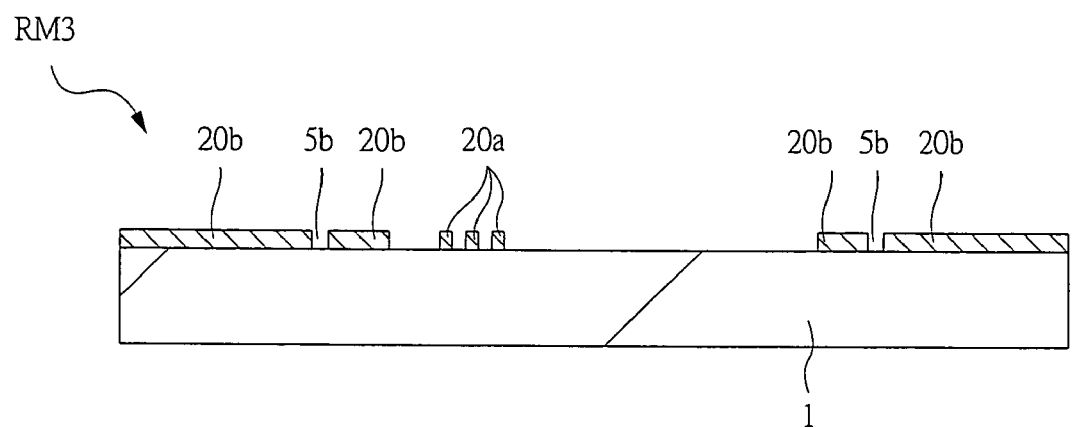
FIG. 16 is a cross-sectional view taken along line A3-A3 in FIG. 15.

Referring to FIGS. 15 to 24, one example of a mask fabrication method according to the second embodiment will be described in line with the process chart of FIG. 14. First of all, there is prepared a metal-equipped mask substrate in which a metal film comprising stacking, for example, chromium (Cr) or stacking chromium oxide (CrO) on chromium is deposited on the entire surface of the first main surface of a mask substrate (step 200 of FIG. 14). Subsequently, a resist film is coated on a metal film of the first main surface of the mask substrate, and thereafter desired patterns are written on the resist film by an electron beam writing processing, and resist patterns for etching mask are formed by further performing development and an after-treatment (steps 201 to 203 of FIG. 14). Then, after the lower metal film is etched using the resist pattern as an etching mask, the resist pattern is removed (steps 204 and 205 of FIG. 14). One example of the mask at this stage is shown in FIGS. 15 and 16. FIG. 15 is a plan view showing the entirety of the mask RM3 in course of the manufacture of the second embodiment, and FIG. 16 is a cross-sectional view taken along line A3-A3 of FIG. 15. In the chip transferred region CAm of the mask RM3, a plurality of metal patterns 20a are arranged for light-shielding. These metal patterns 20a are light-shielding patterns for transferring the integrated circuit patterns. An area from the outer circumference of the chip transferred region CAm to that of the mask substrate 1 is covered with a metal pattern 20b. Part of this metal pattern 20b is removed and a plurality of light transparent patterns 5b and 5c are formed. Light transparent patterns 5c are mark patterns corresponding to the respective metal patterns 3a of the above-mentioned masks RM1 and RM2.

Next, with respect to the mask RM3 at this stage, presence or absence of defect of the metal patterns 20a and 20b, etc. has been inspected by a regular chip comparison method or a method of comparing design data and mask patterns (step 206 of FIG. 14). If no defect is detected, the mask progresses to the next resist light-shielding material coating step 300. If some defect is detected, whether or not the defect can be repaired is determined. If the repair is not possible, the mask is discarded. If the repair is possible, the mask progresses to a repairing process to repair the defect (steps 207 and 208 of FIG. 14). After the repairing process, the mask progresses to a washing step and a foreign-matter inspection step. If any foreign matters are detected, the mask returns to the washing step. On the other hand, if no foreign matters are detected, the mask progresses to the next resist light-shielding material coating step 300 (step 209 and 210 of FIG. 14).

Figure 17:
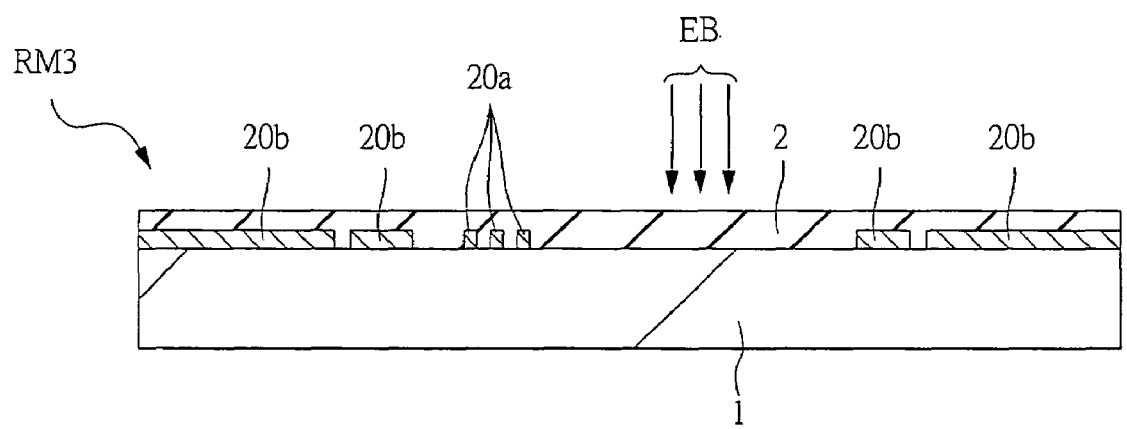
FIG. 17 is a cross-sectional view corresponding to the view taken along the line A3-A3 of FIG. 15, in the mask fabrication process following FIGS. 15 and 16.
Figure 18:
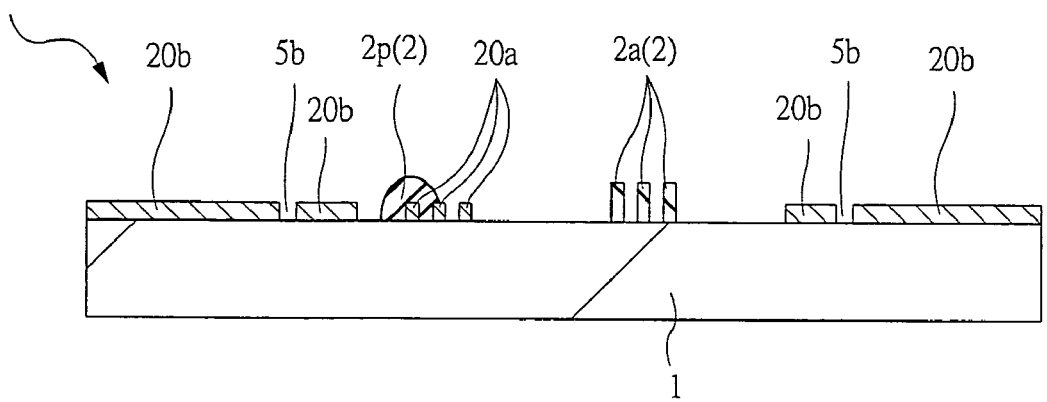
FIG. 18 is a cross-sectional view corresponding to the view taken along the line A3-A3 of FIG. 15, in the mask fabrication process following FIG. 17.
Figure 19:
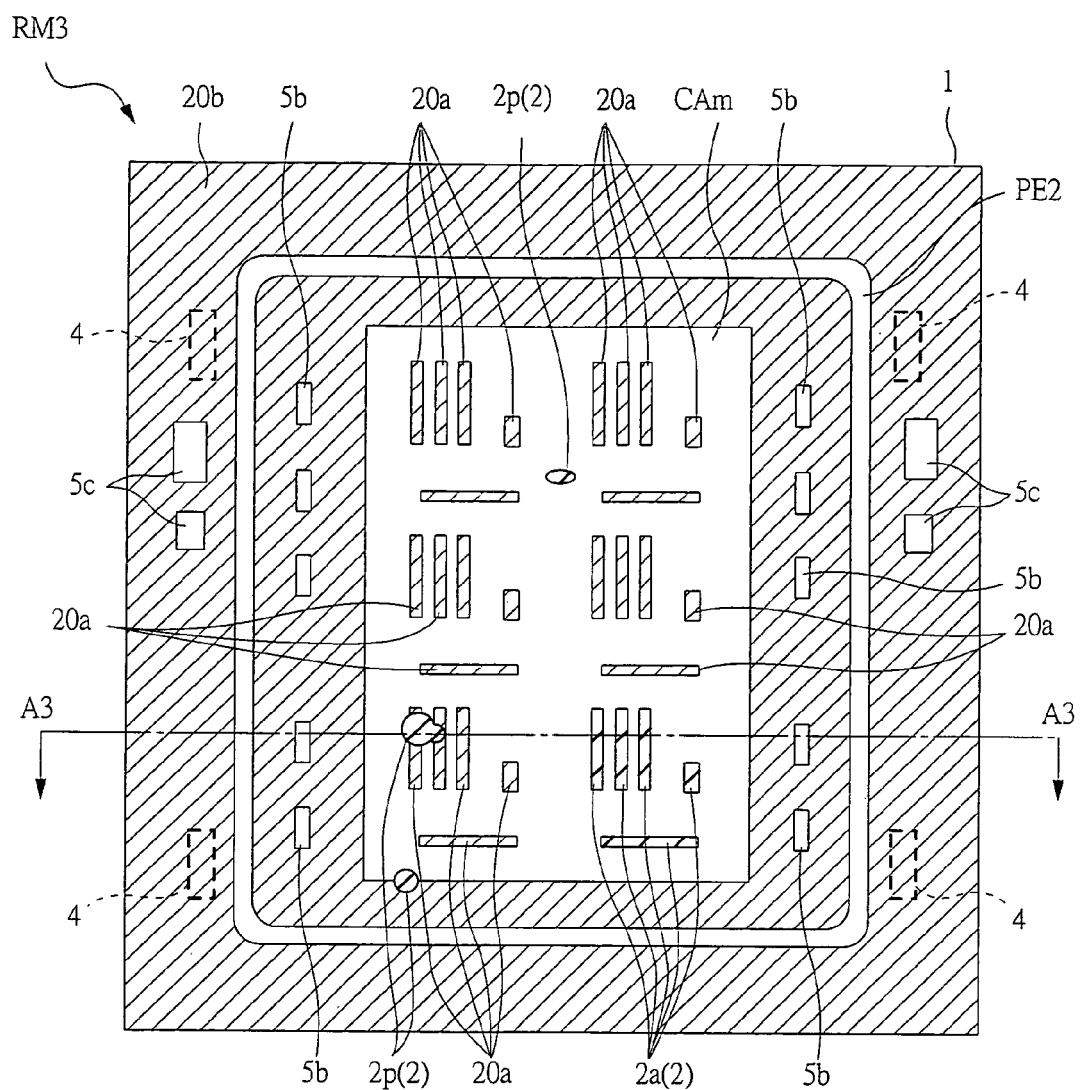
FIG. 19 is a plan view showing the entirety of a mask in the mask fabrication process following FIG. 18.
Figure 20:
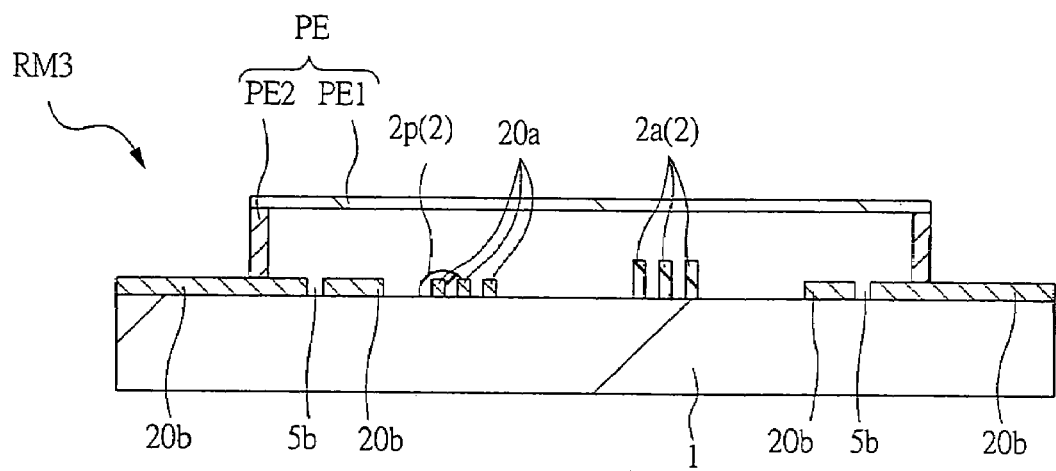
FIG. 20 is a cross-sectional view taken along line A3-A3 of FIG. 19.

Next, in the resist light-shielding material coating step 300, as shown in FIG. 17, the EB resist film 2 having light-shielding effects on exposure light and having been explained in the first embodiment is coated on the first main surface (each forming surface of the metal patterns 20a and 20b) of the mask substrate 1. Subsequently, the presence or absence of defect is inspected, and if any defect is found, the mask returns to the resist light-shielding material coating step 300 through the reproducing process (steps 301 and 302 of FIG. 14). In the reproducing process step 302, the EB resist film 2 on the mask flank 1 is removed. As another fabrication route, it is also possible to introduce a reused mask with metal patterns (similar to that in FIG. 15) into the reproducing process step 302 (step 400 of FIG. 14), the reused mask being stocked so as to allow pattern-changes of only a resist pattern section for transferring integrated circuit patterns. Since this reused mask has already been inspected and repaired, etc., the use of such a reused mask allows mask fabrication TAT to be shortened and its price to be reduced. If no defect is detected in the defect inspection step 301, the electron beam EB is selectively irradiated to a desired pattern portion of the EB resist film 2, as shown in FIG. 17, and thereafter the development treatment and after-treatment are performed by a regular method to form the desired shape resist patterns 2a on the first main surface of the mask substrate 1 (steps 303 and 304 of FIG. 14). This mask RM3 has metal patterns 20a and resist patterns 2a used as light-shielding bodies for transferring integrated circuit patterns. Also in this case, there is illustrated the case in which the defect 2p formed in the EB resist film 2 is left. Subsequently, as shown in FIGS. 19 and 20, immediately after the above-mentioned resist patterns 2a are formed, the pellicle PE is mounted on the first main surface of the mask substrate 1 (step 305 of FIG. 14). This can prevent new foreign matters from adhering to the first main surface of the mask substrate 1. FIG. 19 is a plan view showing the entirety of one example of the mask RM3, and FIG. 20 is a cross-sectional view taken along line A3-A3 of FIG. 19. The base section of the pellicle frame PE2 is bonded to a metal pattern 20b. Note that a partial resist mask as described above is disclosed in Japanese Patent Application No. 2000-206728 or No. 2000-206729 (both filed on Jul. 7, 2000) including the present inventors.

Figure 21:
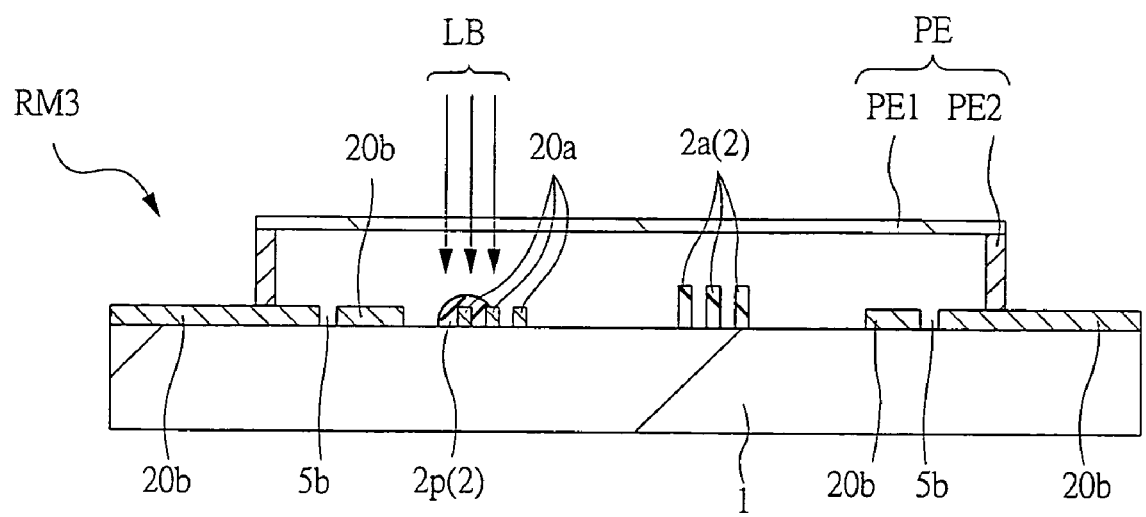
FIG. 21 is a cross-sectional view corresponding to the view taken along the line A3-A3 of FIG. 19, in the mask fabrication process following FIGS. 19 and 20.
Figure 22:
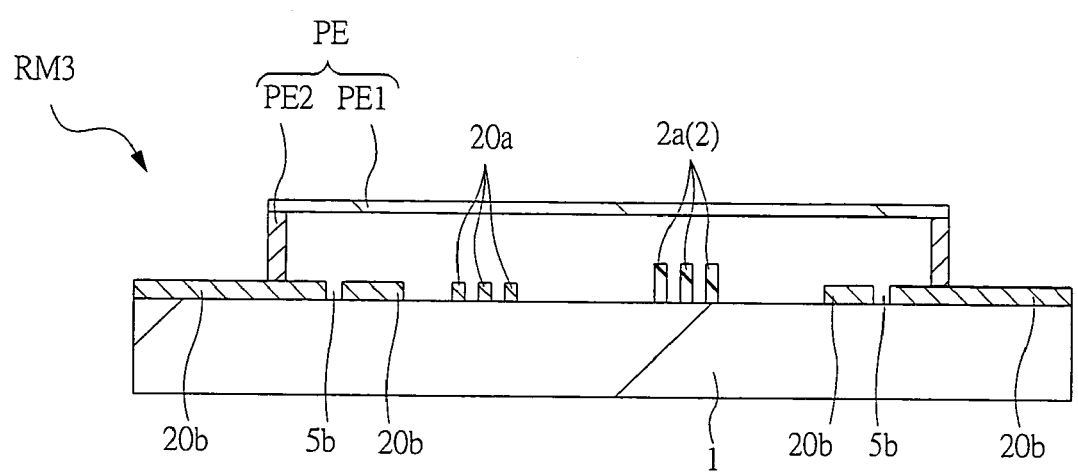
FIG. 22 is a cross-sectional view corresponding to the view taken along the line A3-A3 of FIG. 19, in the mask fabrication process following FIG. 21.
Figure 23:
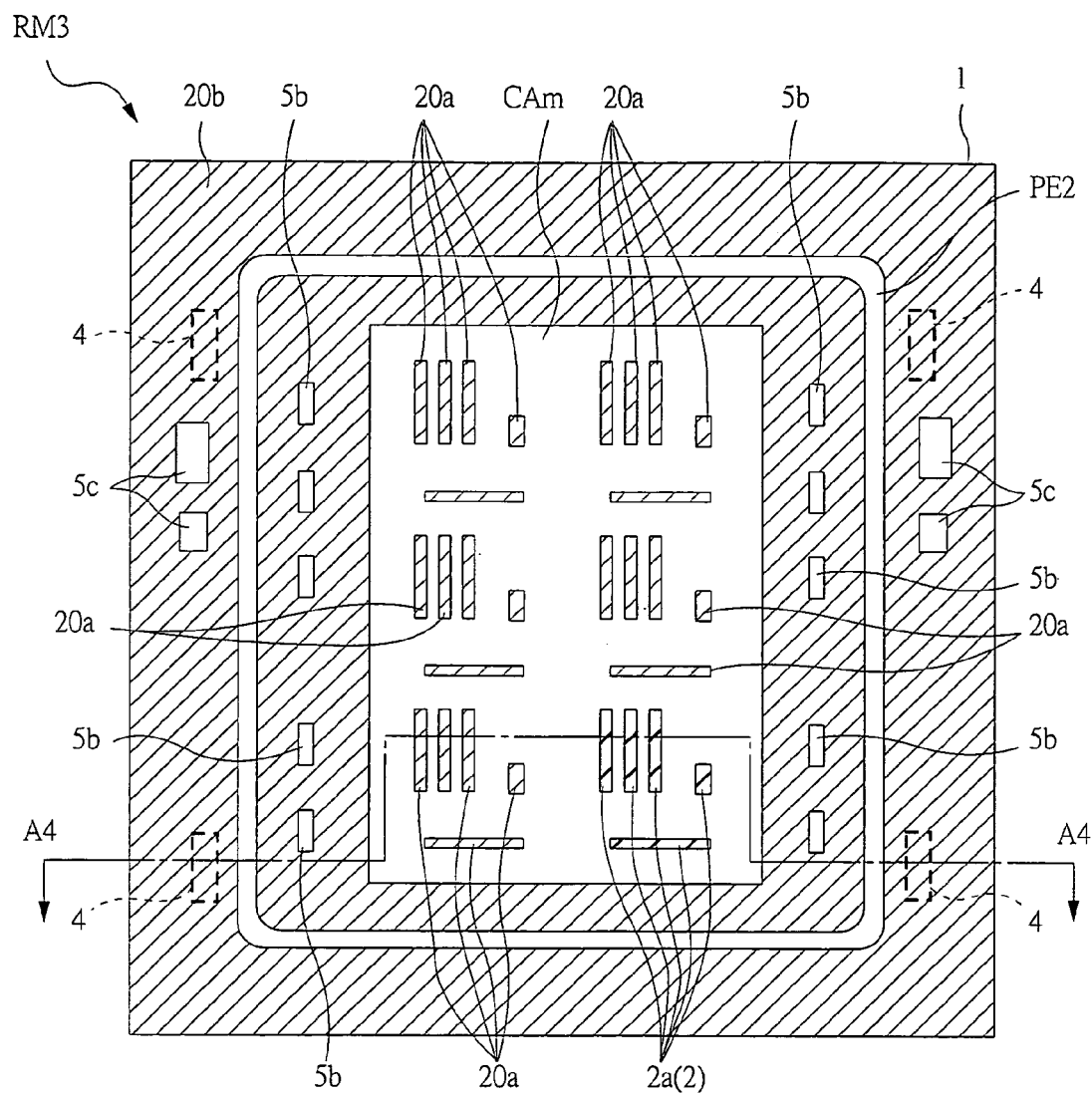
FIG. 23 is a plan view showing one example of the entirety of a mask according to another embodiment of the present invention.
Figure 24:
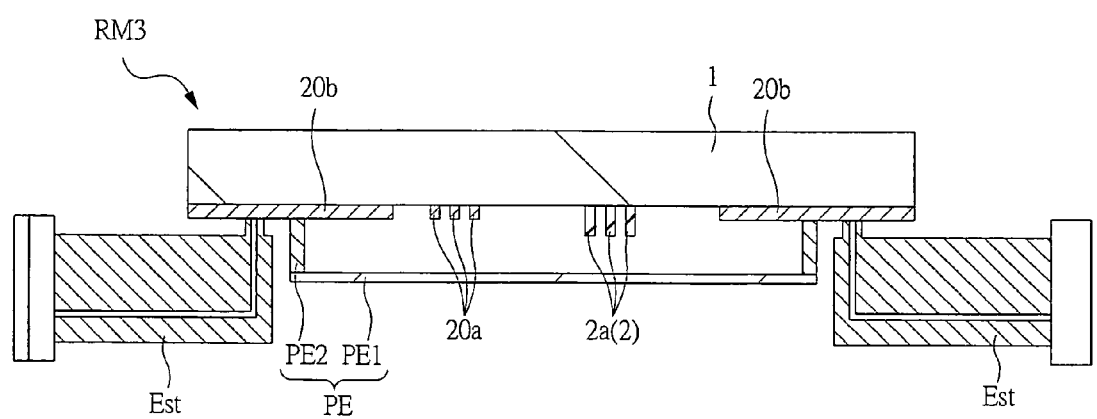
FIG. 24 is a cross-sectional view taken along line A4-A4 of FIG. 23.

Next, also in the second embodiment, with the pellicle PE being mounted, the presence or absence of the defect of the mask RM is inspected by using a defect inspection device etc. (step 306 of FIG. 14), based on the same defect inspection method as that described in the first embodiment (inspection method using a foreign-matter inspection device of FIG. 11). If no defect exists as a result of the above-mentioned defect inspection, the mask RM3 is packed and shipped (step 500 of FIG. 14). Meanwhile, if any defect is detected, for example, the mask progresses to a defect repairing step as follows. Also in the second embodiment, the defect repairing process will be explained by taking, as one example, the repairing of the defect 2p (dark defect) formed in the EB resist film 2. First of all, whether or not the defect 2p can be repaired is determined. If the repairing is not possible, the mask is returned to the reproducing process and the EB resist film 2 including the defect 2p of the mask substrate 1 is removed (step 302 of FIG. 14). Meanwhile, if the defect repair is possible, the defect 2p of the mask RM is repaired with the pellicle PE being mounted (step 308 of FIG. 14). Similarly to the first embodiment, the defect is repaired so that the laser beam LB is, as shown in FIG. 21, irradiated to the defect 2p located on the first main surface of the mask substrate 1 with the pellicle PE being mounted, whereby the defect 2p is thermally decomposed and diminished as shown in FIG. 22. Since the defect 2p made from an organic matter such as a resist can be decomposed by energy lower than that required for decomposing a metal, even the defect 2p with which the metal pattern 2a is covered is selectively removed without giving any damages to the metal pattern 2a. Also at this case, conditions of repair energy such as the laser beam LB and conditions of a gas atmosphere inside the pellicle PE and of quality of material of the pellicle PE are the same as those of the first embodiment. After the above-mentioned defect repair, defect inspection is carried out in the same manner as that described in step 306 of FIG. 14 (step 309 of FIG. 14). If no defect exists, the mask RM is packed and shipped (step 500 of FIG. 14). One example of the mask RM3 thus fabricated is shown in FIGS. 23 and 24. FIG. 23 is a plan view showing the entirety of the mask RM3, and FIG. 24 is a cross-sectional view taken along line A4-A4 of FIG. 23 at the time of exposure. In the chip transferred region CAm, both the metal patterns 20a for transferring the integrated circuit patterns and the resist patterns 2a are arranged. The stage Est is brought in contact with the metal patterns 20b.

Embodiment 3

In a third embodiment, description will be made of a process method at the time when a resist mask and a regular mask are mixed in a mask fabrication line.

Figure 25:
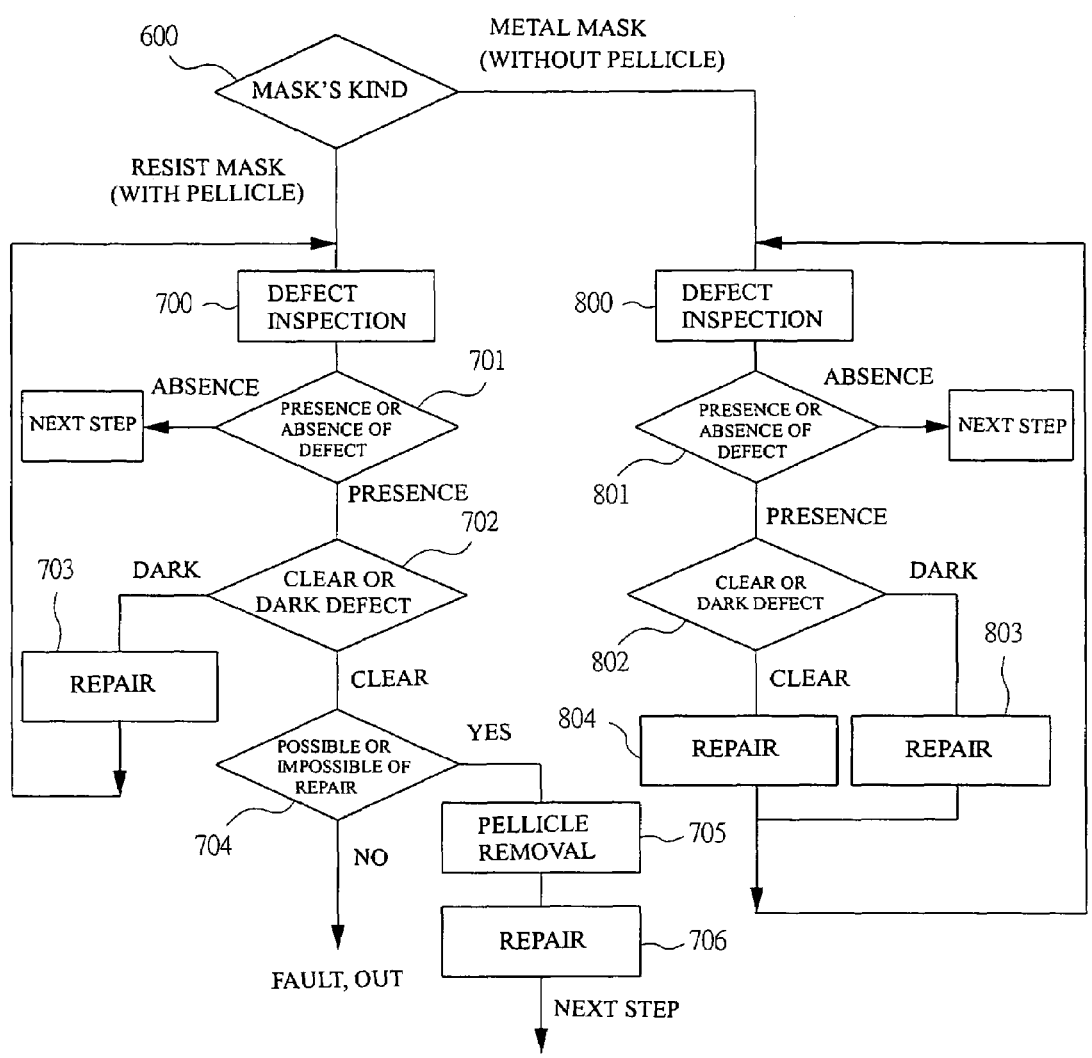
FIG. 25 is a process chart showing one example of a mask fabrication method according to another embodiment of the present invention.

FIG. 25 shows one example of a process chart for fabricating masks according to the third embodiment. In the mask fabrication line, the above-mentioned regular masks and masks of different type in resist masks are fabricated in some cases. At this case, by efficiently carrying out defect inspection and repair corresponding to each mask, the entire production efficiency of the masks can be improved. Therefore, in the third embodiment, first of all, whether masks carried into a fabrication process are resist or regular ones (metal masks) is determined (step 600 of FIG. 25). If the determined results indicate that such masks are resist ones (mask RM and RM1 to RM3) as described in the first and second embodiments, the masks progress to the defect inspection step with the pellicle being mounted in the same manner as those described in the first and second embodiments (step 700 of FIG. 25). At this time, if no defect exists, the masks progress to the next step. If any defect is defected, it is determined whether the defect is clear defect (fracture defect) or dark defect (residual defect) (steps 701 and 702 of FIG. 25). In the case of the dark defect (for example, made from a resist), with the pellicle being mounted as described in the first and second embodiments, the dark defect is removed by a laser beam etc., and the masks return to the defect inspection step 700. Meanwhile, in the case of the clear defect, whether or not the defect can be repaired is determined. If the repairing of the defect is not possible, the masks are discarded. If the repairing is possible, the pellicle is removed and the clear defect is repaired and the masks progress to the next step (steps 704 to 706 of FIG. 25). The above-mentioned clear defect is repaired by, for example, a method of: irradiating a focus ion beam (for example, gallium (Ga) ions) to the defect portion while an organic gas is being sprayed onto the defect region; decomposing the organic gas; and depositing a carbon-based film on the clear defect portion to cover the clear defect portion, or a method of: irradiating an ultraviolet laser beam to the defect portion in a Cr ($CO_6$) gas atmosphere; generating chrome (Cr) at the clear defect portion; and covering the clear defect portion, or the like.

Figure 26:
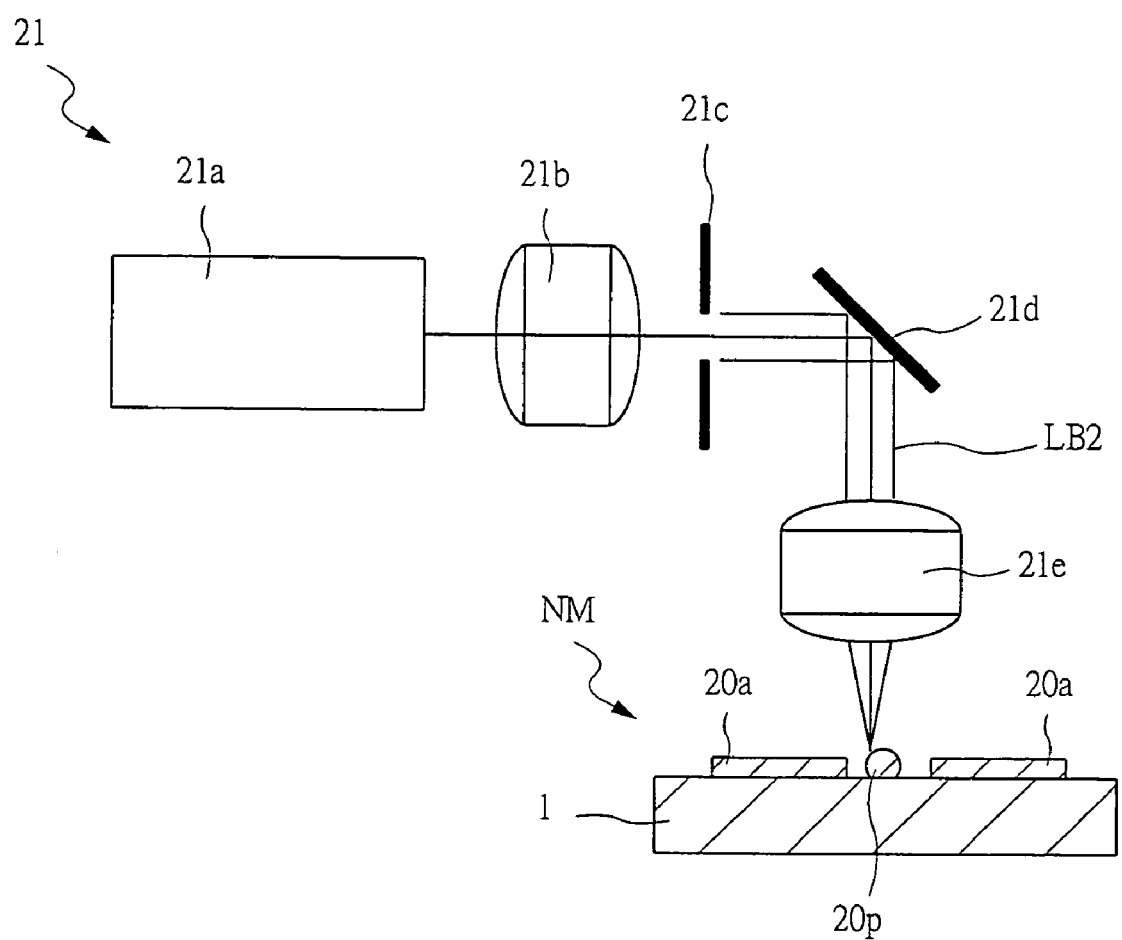
FIG. 26 is an explanatory view showing one example of dark defect repairing device employed in the mask fabrication process according to another embodiment of the present invention.

Meanwhile, when it is determined that the masks are regular ones in step 600, the masks progress to the defect inspection step without mounting the pellicle (step 800 of FIG. 25). Also in this case, if no defect exists, the masks progress to the next step. If any defect is detected, it is determined whether the detected defect is clear or dark one (steps 801 and 802 of FIG. 25). In the case of the dark defect, the dark defect is removed by a laser beam etc., and the masks return to the defect inspection step 800. Meanwhile, in the case of the clear defect, the clear defect is repaired in the same repair method as that described above and the masks return to the defect inspection step 800 (steps 803 and 804 of FIG. 25). The above-mentioned dark defect may be repaired by, for example, a method of: irradiating, to the dark defect portion, a laser beam (e.g., a YAG laser (with a wavelength of 0.53 im)) or focus ion beam (FIB: Focused Ion Beam); and removing the dark defect portion. FIG. 26 shows one example of a repair device 21 for repairing the above-mentioned dark defect. This repair device 21 has a laser source 21a, a lens 21b, a slit 21c, a mirror 21d, an objective lens 21e, and a stage for placing the above-mentioned regular mask NM. A laser beam LB2 radiated from this laser beam source 21a is adjusted in a beam diameter by the lens 21b, and then is adjusted in irradiation width through the slit 21c capable of changing its width, and is irradiated to the mirror 21d. A laser beam LB2 irradiated to the mirror 21d is folded in a beam path by the mirror 21d, and is irradiated to the regular mask NM through the objective lens 21e. On the first main surface of the mask substrate of this regular mask NM, there are formed the light-shielding metal patterns 20a for transferring the integrated circuit patterns. The reference numeral "20p" indicates defect made from the same metal material, for example, chrome etc. as that of the metal pattern 20a. In removing the defect 20p, the above-mentioned stage is moved to move the regular mask NM, and the laser beam LB2 is irradiated to the defect 20p located on the mask substrate 1 to evaporate the defect 20p. By moving the position of the slit 21c instead of moving the stage, transferred image by the laser beam LB2 may be moved.

Thus, according to the third embodiment, in addition to effects obtained by the first and second embodiments, the following effects can be obtained. That is, in the mask manufacturing process in which both of the regular masks and the resist masks flow, by separating the inspection and repair processes for the regular mask and those for the resist mask, the overall production efficiency in the mask fabrication process can be improved.

As described above, the inventions made by the present inventors have been concretely described based on the embodiments. However, needless to say, the present invention is not limited to the above-mentioned embodiments, and can be variously modified and altered without departing from the gist thereof.

In the first to third embodiments, the masks for transferring the line patterns have been illustrated, but the present invention is not limited to such masks, and can be applied to masks for transferring, for example, hole patterns such as contact holes and through holes.

Further, the metal pattern that forms the light-shielding body in the mask is not limited to chromium and can be variously changed and modified, and, for example, a refractory metal film such as tungsten and molybdenum or a refractory metal nitride film in which they are nitrided or the like may be used.

Additionally, in the first to third embodiments, the method of repairing the dark defect made from the resist film of the resist mask with the pellicle being mounted thereon has been described, but the present invention is not limited to this. There may be employed a method of removing the defect made from, for example, a metal film by an energy beam such as a laser beam, with the pellicle being mounted thereon, and repairing it. At this time, it is preferable to select the wavelength etc. of the laser beam and quality of material of the pellicle film in such a manner that absorption of the laser beam for repair into the pellicle film can be reduced.

In the foregoing description, the invention made by the present inventors has been mainly described about the case where it is applied to a fabrication method for the semiconductor integrated circuit devices with the CMIS circuits, which is the background of the invention and belongs to the technical field thereof. However, the invention is not limited to this method, and can be, for example, applied to fabrication methods for: a semiconductor integrated circuit device with a memory circuit such as a DRAM (Dynamic Random Access Memory), SRAM (Static Random Access Memory), or flash memory (EEPROM: Electric Erasable Programmable Read Only Memory); a semiconductor integrated circuit device with a logic circuit such as a microprocessor; a mixed type semiconductor integrated circuit device in which both a memory circuit and a logic circuit are mounted on the same semiconductor substrate; other various kinds of semiconductor integrated circuit devices; and the like. Additionally, the present invention can be applied to fabrication methods for a liquid crystal display unit and/or a micro-machine, and a fabrication method including a step of exposure-transferring a micro pattern.

The effects obtained by representative ones of the inventions disclosed in the present application will be briefly described as follows.

That is, by repairing the defect located on the mask substrate with the pellicle being mounted on the mask substrate, it becomes possible to shorten the mask fabrication time.

What is claimed is:

1. A mask fabrication method comprising the steps of:
   (a) preparing a mask substrate;
   (b) depositing, on said mask substrate, a light-shielding film with light-shielding characteristics with respect to exposure light for an exposure process using a mask;
   (c) forming a light-shielding pattern by patterning said light-shielding film;
   (d) mounting a pellicle on said mask substrate after forming said light-shielding pattern;
   (e) inspecting the mask substrate with said light-shielding pattern; and
   (f) repairing defect of said mask substrate in accordance with inspection results with said pellicle being mounted.

2. The mask fabrication method according to claim 1, wherein said light-shielding pattern is an organic film.

3. The mask fabrication method according to claim 2, wherein said organic film is a resist film.

4. The mask fabrication method according to claim 1, wherein said light-shielding pattern includes a metal film.

5. The mask fabrication method according to claim 1, wherein a process for repairing said defect is carried out by irradiating a laser beam to said defect with said pellicle being mounted.

6. The mask fabrication method according to claim 5, wherein the wavelength of said laser beam is close to that of exposure light at the time of said exposure process.

7. The mask fabrication method according to claim 1, wherein a process for repairing said defect is carried out in such a state that an atmosphere surrounded by said pellicle and said mask substrate is set to be an atmosphere of a gas other than ambient air.

8. A mask fabrication method comprising the steps of:
   (a) preparing a mask substrate;
   (b) depositing, on said mask substrate, a resist film with light-shielding characteristics with respect to exposure light for an exposure process using a mask;
   (c) forming a light-shielding pattern by patterning said resist film;
   (d) mounting a pellicle on said mask substrate after forming said light-shielding pattern;
   (e) inspecting the mask substrate with said light-shielding pattern; and
   (f) repairing defect of said mask substrate in accordance with inspection results with said pellicle being mounted.

9. The mask fabrication method according to claim 8, wherein said defect is made from said resist film.

10. The mask fabrication method according to claim 9, wherein a process for repairing said defect is carried out by irradiating a laser beam to said defect with said pellicle being mounted.

11. The mask fabrication method according to claim 8, wherein a process for repairing said defect is carried out in such a state that an atmosphere surrounded by said pellicle and said mask substrate is set to be an atmosphere of a gas other than ambient air.

12. A mask fabrication method comprising the steps of:
   (a) preparing a mask substrate;
   (b) depositing, on said mask substrate, a metal film with light-shielding characteristics with respect to exposure light for an exposure process using a mask;
   (c) forming a first light-shielding pattern by patterning said metal film;
   (d) depositing, on the mask substrate on which said first light-shielding pattern is formed, a resist film with light-shielding characteristics with respect to exposure light for an exposure process using a mask;
   (e) forming a second light-shielding pattern by patterning said resist film;
   (f) mounting a pellicle on said mask substrate after forming said first and second light-shielding patterns;
   (g) inspecting the mask substrate with said first and second light-shielding patterns; and
   (h) removing defect made from said resist film of said mask substrate in accordance with inspection results with said pellicle being mounted.

13. The mask fabrication method according to claim 12, wherein defect made from said resist film located in the vicinity of said first light-shielding pattern or being in contact with said first light-shielding pattern is selectively removed in a process for repairing said defect.

14. The mask fabrication method according to claim 12, wherein a process for repairing said defect is carried out by irradiating a laser beam to said defect with said pellicle being mounted.

15. The mask fabrication method according to claim 14, wherein the wavelength of said laser beam is close to that of exposure light at the time of said exposure process.

16. The mask fabrication method according to claim 12, wherein a process for repairing said defect is carried out in such a state that an atmosphere surrounded by said pellicle and said mask substrate is set to be an atmosphere of a gas other than ambient air.

17. A fabrication method of semiconductor integrated circuit device, comprising the steps of:
 (a) preparing a mask substrate;
 (b) depositing, on said mask substrate, a light-shielding film with light-shielding characteristics with respect to exposure light for an exposure process using a mask;
 (c) forming a light-shielding pattern by patterning said light-shielding film;
 (d) mounting a pellicle on said mask substrate after forming said light-shielding pattern;
 (e) inspecting the mask substrate with said light-shielding pattern;
 (f) repairing defect of said mask substrate with the pellicle being mounted in accordance with inspection results, and fabricating a mask;
 (g) preparing a wafer;
 (h) depositing a resist film on a main surface of said wafer; and
 (i) transferring a desired pattern onto said resist film by an exposure process using said mask.

18. The fabrication method of semiconductor integrated circuit device according to claim 17, wherein said light-shielding pattern is an organic film.

19. The fabrication method of semiconductor integrated circuit device according to claim 18, wherein said organic film is a resist film.

20. The fabrication method of semiconductor integrated circuit device according to claim 17, wherein said light-shielding pattern contain a metal film.

21. The fabrication method of semiconductor integrated circuit device according to claim 17, wherein a process for repairing said defect is carried out by irradiating a laser beam to said defect with the pellicle being mounted.

* * * * *